United States Patent
Ando et al.

(10) Patent No.: US 10,452,209 B2
(45) Date of Patent: Oct. 22, 2019

(54) TOUCH PANEL MEMBER, TOUCH PANEL, AND TOUCH PANEL DISPLAY DEVICE

(71) Applicant: FUJIFILM Corporation, Tokyo (JP)

(72) Inventors: Takeshi Ando, Shizuoka (JP); Hideyuki Nakamura, Shizuoka (JP); Shigekazu Suzuki, Shizuoka (JP); Satoru Yamada, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/046,453

(22) Filed: Feb. 18, 2016

(65) Prior Publication Data

US 2016/0274695 A1  Sep. 22, 2016

(30) Foreign Application Priority Data

Mar. 20, 2015 (JP) .................. 2015-057445

(51) Int. Cl.
*G06F 3/041* (2006.01)
*G06F 3/044* (2006.01)
(Continued)

(52) U.S. Cl.
CPC .............. *G06F 3/044* (2013.01); *G02B 1/111* (2013.01); *G02B 1/113* (2013.01); *G02B 1/115* (2013.01);
(Continued)

(58) Field of Classification Search
CPC ............. H01L 51/5275; H01L 51/5253; H01L 51/5203; H01L 51/5262; H01L 51/5256;
(Continued)

(56) References Cited

U.S. PATENT DOCUMENTS 4,556,288 A * 12/1985 Sekimura .......... G02F 1/133502
349/137
5,003,221 A *  3/1991 Shimizu ................ H05B 33/22
313/114
(Continued)

FOREIGN PATENT DOCUMENTS

JP     2007212815     8/2007
JP     2009173910     8/2009
(Continued)

OTHER PUBLICATIONS

"Office Action of Japan Counterpart Application," with machine English translation thereof, dated Apr. 3, 2018, p. 1-p. 4.
(Continued)

*Primary Examiner* — Dismery Mercedes
(74) *Attorney, Agent, or Firm* — JCIPRNET

(57) ABSTRACT

The object of the present invention is to provide a touch panel member that is excellent in terms of suppression of visibility of a transparent electrode and has low total reflection for visible light, and a touch panel and a touch panel display device having the touch panel member.
The touch panel member of the present invention comprises, in order, at least a transparent substrate, a transparent electrode, and a protective layer provided so as to cover the transparent electrode and having a thickness of 0.04 to 10 µm, at least part of the protective layer having a refractive index that decreases continuously from the transparent substrate side toward the side opposite to the transparent substrate, and the protective layer satisfying specific expressions.

13 Claims, 1 Drawing Sheet

(51) Int. Cl.
| | |
|---|---|
| *G02F 1/1335* | (2006.01) |
| *G02B 1/115* | (2015.01) |
| *G02F 1/133* | (2006.01) |
| *G02B 1/113* | (2015.01) |
| *G02B 1/111* | (2015.01) |
| *G02B 1/14* | (2015.01) |
| *G02F 1/1333* | (2006.01) |
| *H01L 51/52* | (2006.01) |

(52) U.S. Cl.
CPC .............. *G02B 1/14* (2015.01); *G02F 1/133* (2013.01); *G02F 1/13338* (2013.01); *G02F 1/133502* (2013.01); *G06F 3/041* (2013.01); *G06F 3/0412* (2013.01); *H01L 51/5262* (2013.01); *H01L 51/5275* (2013.01); *G02F 2001/133565* (2013.01)

(58) Field of Classification Search
CPC ..... H01L 51/5234; H01L 33/42; H01L 33/44; H01L 27/1462; H01L 27/3244; H01L 2251/558; H01L 2251/301; H01L 2251/5346; G02F 1/13338; G02F 1/133502; G02F 1/133; G02F 2201/50; G06F 3/044; G06F 3/041; G06F 3/0412; G02B 1/111; G02B 1/113; G02B 1/115; G02B 1/14; G02B 1/105
See application file for complete search history.

(56) References Cited

U.S. PATENT DOCUMENTS

| | | | | |
|---|---|---|---|---|
| 7,554,263 | B2* | 6/2009 | Takahashi | H01L 51/5262 257/100 |
| 9,185,619 | B2 | 11/2015 | Meshkati et al. | |
| 9,433,089 | B2* | 8/2016 | Kim | G06F 3/044 |
| 9,605,337 | B2* | 3/2017 | Hsu | C23C 14/06 |
| 9,632,635 | B2* | 4/2017 | Misaki | G06F 3/0412 |
| 9,632,640 | B2* | 4/2017 | Kanna | G06F 3/0412 |
| 9,971,433 | B2* | 5/2018 | Ando | G06F 3/041 |
| 9,983,423 | B2* | 5/2018 | Hsieh | G02F 1/133 |
| 2004/0160165 | A1* | 8/2004 | Yamauchi | H01L 27/3246 313/498 |
| 2007/0188689 | A1* | 8/2007 | Nakamura | G02F 1/133502 349/122 |
| 2007/0287009 | A1* | 12/2007 | Okude | G02B 5/305 428/411.1 |
| 2008/0088932 | A1* | 4/2008 | Cho | G02B 1/113 359/586 |
| 2009/0104467 | A1* | 4/2009 | Son | B32B 7/02 428/516 |
| 2009/0257003 | A1* | 10/2009 | Yoshihara | G02B 1/105 349/96 |
| 2010/0019269 | A1* | 1/2010 | Kim | H01L 33/42 257/99 |
| 2010/0225612 | A1* | 9/2010 | Ishizaki | G02F 1/13338 345/174 |
| 2011/0121272 | A1* | 5/2011 | Lee | H01L 51/5088 255/40 |
| 2012/0249441 | A1* | 10/2012 | Lee | G06F 3/044 345/173 |
| 2014/0334006 | A1* | 11/2014 | Adib | G02B 1/105 359/580 |
| 2014/0335351 | A1* | 11/2014 | Ueno | G02F 1/133502 428/339 |
| 2015/0077646 | A1* | 3/2015 | Chen | G06F 1/1643 349/12 |
| 2015/0169110 | A1* | 6/2015 | Nah | G06F 3/044 345/174 |
| 2015/0251393 | A1 | 9/2015 | Kanna et al. | |
| 2015/0370395 | A1* | 12/2015 | Hsu | G06F 3/0412 345/174 |
| 2016/0007438 | A1* | 1/2016 | Hsu | C23C 14/06 174/268 |
| 2016/0084991 | A1* | 3/2016 | Umemoto | G02B 1/111 359/609 |
| 2018/0001606 | A1 | 1/2018 | Kanna et al. | |

FOREIGN PATENT DOCUMENTS

| | | |
|---|---|---|
| JP | 2010-137447 | 6/2010 |
| JP | 2013-535868 | 9/2013 |
| JP | 2014-085612 | 5/2014 |
| JP | 2014108541 | 6/2014 |
| JP | 2014178922 | 9/2014 |
| JP | 2014240955 | 12/2014 |
| WO | 2012006194 | 1/2012 |

OTHER PUBLICATIONS

"Office Action of Japan Counterpart Application," dated Oct. 24, 2017, with English translation thereof p. 1-p. 7.
"Office Action of Japan Counterpart Application," dated Aug. 31, 2018, and "Notification of Lifting of Pre-appeal Examination Status of Japan Counterpart Application" dated Sep. 11, 2018,with partial English translation thereof, p. 1-p. 5.
"Office Action of Japan Counterpart Application", dated Jul. 2, 2019, with English translation thereof, p. 1-p. 8.

* cited by examiner

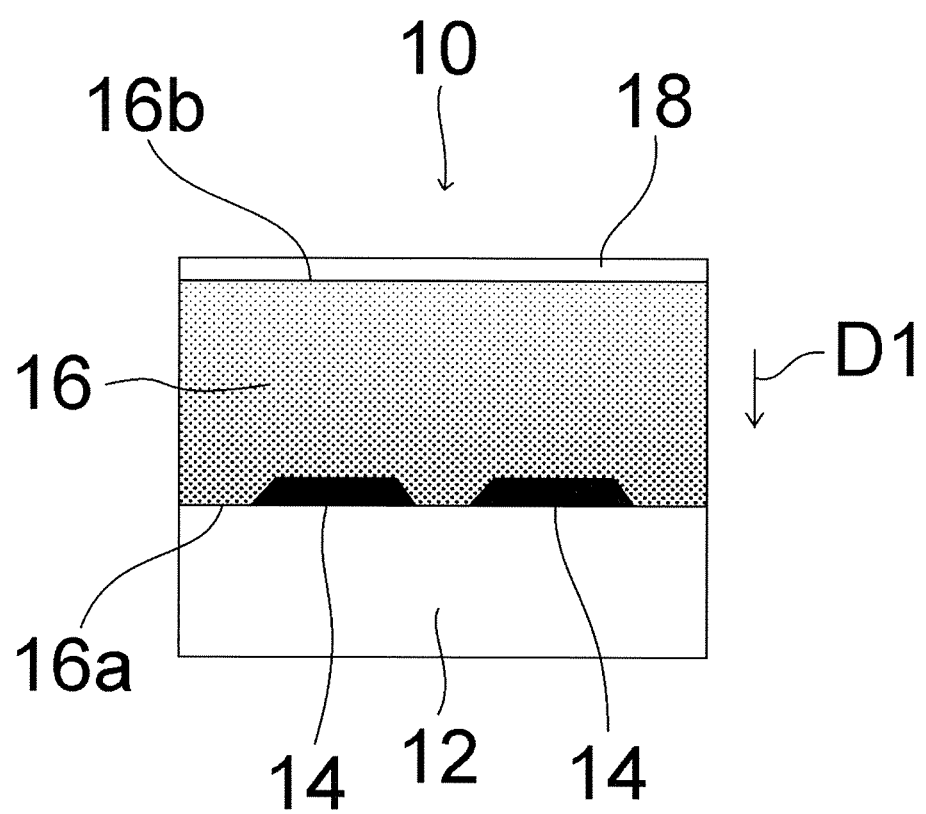

TOUCH PANEL MEMBER, TOUCH PANEL, AND TOUCH PANEL DISPLAY DEVICE

CROSS-REFERENCE TO RELATED APPLICATION

The present application claims a Paris Convention priority to Japanese Patent Application No. 2015-057445 filed on Mar. 20, 2015. The contents of the basic application are incorporated herein by reference in their entirety.

TECHNICAL FIELD

The present invention relates to a touch panel member, a touch panel, and a touch panel display device.

BACKGROUND ART

Flat panel displays such as liquid crystal display devices and organic EL display devices are widely used. Furthermore, in recent years, accompanying the widespread use of smart phones and tablet terminals, capacitance type touch panels have been attracting attention. A sensor substrate of a capacitance type touch panel usually has a structure in which wiring is formed by patterning ITO (Indium Tin Oxide) or a metal (silver, molybdenum, aluminum, etc.) on glass; in addition, an intersection of the wiring has an insulating film, and there is a protective film for protecting the ITO and the metal.

As a conventional touch panel, those described in published Japanese translation 2013-532868 of a PCT application, JP-A-2010-137447 (JP-A denotes a Japanese unexamined patent application publication) and JP-A-2014-85612 are known.

SUMMARY OF THE INVENTION

Problems to be Solved by the Invention

It is an object of the present invention to provide a touch panel member that is excellent in terms of suppression of visibility of a transparent electrode and has low total reflection for visible light, and a touch panel and a touch panel display device having the touch panel member.

Means for Solving the Problems

The problems of the present invention have been solved by means described in <1>, <11>, or <12> below. They are described together with <2> to <10>, which are preferred embodiments.
<1> A touch panel member comprising, in order, at least a transparent substrate, a transparent electrode, and a protective layer provided so as to cover the transparent electrode and having a thickness of 0.04 to 10 μm, at least part of the protective layer having a refractive index that decreases continuously from the transparent substrate side toward the side opposite to the transparent substrate, and
the protective layer satisfying Expression 1 and Expression 2 below, $$|n(\text{electrode}) - n(\text{protect-electrode})| \leq 0.2 \quad (1)$$

$$0.2 \leq n(\text{protect-electrode}) - n(\text{protect-surface}) \quad (2)$$

wherein in the expressions, the refractive index of the transparent electrode is defined as n(electrode), the refractive index of an interface on the transparent electrode side of the protective layer is defined as n(protect-electrode), and the refractive index of an interface, on the side opposite to the transparent substrate, of the protective layer is defined as n(protect-surface).
<2> The touch panel member according to <1>, wherein the protective layer satisfies Expression 3 below, $$0 \leq \Delta n \leq 0.15 \quad (3)$$

wherein in the expression, Δn denotes the amount of change in the refractive index of the protective layer from a given position of the protective layer to a position moved by 20 nm in the transparent substrate direction along a direction perpendicular to the plane of the transparent substrate on which the transparent electrode is provided.
<3> The touch panel member according to <1> or <2>, wherein a taper angle formed between the plane of the transparent substrate on which the transparent electrode is provided and a side face of the transparent electrode is 2° to 80°,
<4> the touch panel member according to any one of <1> to <3>, wherein the refractive index (n(electrode)) of the transparent electrode is at least 1.76 but no greater than 2.30,
<5> the touch panel member according to <4>, wherein the refractive index (n(electrode)) of the transparent electrode is at least 1.86 but no greater than 2.20,
<6> the touch panel member according to any one of <1> to <5>, wherein it further comprises an adjacent layer that is in contact with the interface, on the side opposite to the transparent substrate, of the protective layer, the protective layer and the adjacent layer satisfying Expression 4 below, $$|n(\text{protect-surface}) - n(\text{adjacent})| \leq 0.2 \quad (4)$$

wherein in the expression, the refractive index of the adjacent layer is defined as n(adjacent).
<7> The touch panel member according to any one of <1> to <6>, wherein the protective layer is a layer comprising an inorganic material and an organic material,
<8> the touch panel member according to any one of <1> to <7>, wherein the protective layer is a layer comprising a compound selected from the group consisting of a titanoxane, a zirconoxane, a titanoxane-zirconoxane condensation product, titanium oxide, zirconium oxide, and a titanium-zirconium composite oxide,
<9> the touch panel member according to <8>, wherein the protective layer is a layer for which the content of the compound selected from the group consisting of a titanoxane, a zirconoxane, a titanoxane-zirconoxane condensation product, titanium oxide, zirconium oxide, and a titanium-zirconium composite oxide decreases from the transparent substrate side toward the side opposite to the transparent substrate,
<10> the touch panel member according to <8> or <9>, wherein the protective layer is a layer comprising titanium oxide particles, zirconium oxide particles, and/or titanium-zirconium composite oxide particles,
<11> a touch panel comprising the touch panel member according to any one of <1> to <10>,
<12> a touch panel display device comprising the touch panel member according to any one of <1> to <10>.

BRIEF DESCRIPTION OF DRAWINGS

FIG. 1: A conceptual sectional view showing one example of the touch panel member of the present invention.

EXPLANATION OF REFERENCE NUMERALS AND SYMBOLS

10: touch panel member, 12: transparent substrate, 14: transparent electrode, 16: protective layer, 16a: interface, on transparent electrode side, of protective layer 16, 16b: interface, on the side opposite to the transparent substrate, of protective layer 16, D1: transparent substrate direction, 18: adjacent layer

MODES FOR CARRYING OUT THE INVENTION

The content of the present invention is explained in detail below. The explanation of the constituent features given below is based on representative embodiments of the present invention, but the present invention should not be construed as being limited to such embodiments. In the present specification, 'to' is used to mean that the numerical values given before and after it are included as a lower limit value and an upper limit value. Furthermore, an organic EL device in the present invention means an organic electroluminescence device.

With regard to the notation of a group (atomic group) in the present specification, a notation that does not indicate whether it is substituted or unsubstituted includes one without a substituent as well as one with a substituent. For example, an 'alkyl group' includes an alkyl group without a substituent (unsubstituted alkyl group) as well as an alkyl group with a substituent (substituted alkyl group).

Furthermore, a chemical structural formula in the present specification might be given using a simplified structural formula in which hydrogen atoms are omitted.

In addition, in the present specification, "(meth)acrylate" denotes acrylate and methacrylate, "(meth)acrylic" denotes acrylic and methacrylic, and "(meth)acryloyl" denotes acryloyl and methacryloyl.

In the present invention, 'at least one type selected from the group consisting of a1 to a3', etc. is also called simply 'Component A', etc.

Furthermore, in the present invention, 'mass %' and 'wt %' have the same meaning, and 'parts by mass' and 'parts by weight' have the same meaning.

Moreover, in the present invention, a combination of two or more preferred embodiments is a more preferred embodiment.

The weight-average molecular weight and number-average molecular weight of a resin, a titanoxane, a zirconoxane, and a titanoxane-zirconoxane condensation product in the present invention are measured using a gel permeation chromatography (GPC) method.

(Touch Panel Member)

The touch panel member of the present invention comprises, in order, at least a transparent substrate, a transparent electrode, and a protective layer provided so as to cover the transparent electrode and having a thickness of 0.04 to 10 µm, at least part of the protective layer having a refractive index that decreases continuously from the transparent substrate side toward the side opposite to the transparent substrate, and the protective layer satisfying Expression 1 and Expression 2 below.

$$|n(\text{electrode}) - n(\text{protect-electrode})| \leq 0.2 \tag{1}$$

$$0.2 \leq n(\text{protect-electrode}) - n(\text{protect-surface}) \tag{2}$$

In the expressions, the refractive index of the transparent electrode is defined as n(electrode), the refractive index of an interface on the transparent electrode side of the protective layer is defined as n(protect-electrode), and the refractive index of an interface, on the side opposite to the transparent substrate, of the protective layer is defined as n(protect-surface).

The refractive index in the present invention is the refractive index for light at a wavelength of 550 nm at 25° C. unless otherwise specified.

With regard to a method for measuring refractive index, it may be measured using an ellipsometer under conditions of a measurement temperature of 25° C. and a measurement wavelength of 550 nm. Furthermore, a change in the refractive index in the film thickness direction may be estimated based on observation of a cross section using X-ray photoelectron spectroscopic analysis or electron microscopy, and a suitable optical model may be selected and fitting may be carried out. Moreover, measurement may be carried out by a spectroscopic ellipsometry method based on the fitting.

There are the problems of visibility of a touch panel electrode and reflectance of the touch panel.

With regard to the reflectance of the touch panel, when the reflectance is high, external light is reflected to a greater extent, and the display is more difficult to see outdoors, etc.

Furthermore, there are two types of visibility of a touch panel electrode; one thereof is the visibility (framework visibility) of an electrode due to a difference in refractive index between a transparent electrode (for example, ITO: refractive index 1.90) and a transparent substrate as a base (for example, glass: refractive index 1.5, polyethylene terephthalate (PET): refractive index 1.5), and the other is the visibility (taper visibility) of an electrode due to the reflection of light from a taper part, which is a side face portion of a transparent electrode.

Now, as a result of an intensive investigation by the present inventors, it has been found that a touch panel member that is excellent in terms of suppression of visibility (suppression of framework visibility and suppression of taper visibility) of a transparent electrode and has low total reflection of visible light can be obtained by forming a protective layer for a transparent electrode as a layer in which the refractive index decreases continuously from the transparent substrate side toward the side opposite to the transparent substrate and setting the refractive index of each part of the protective layer within a specific range, and the present invention has thus been accomplished.

<Protective Layer>

The touch panel member of the present invention comprises a protective layer provided so as to cover the transparent electrode and having a thickness of 0.04 to 10 µm, at least part of the protective layer having a refractive index that decreases continuously from the transparent substrate side toward the side opposite to the transparent substrate, and the protective layer satisfying Expression 1 and Expression 2 below.

$$|n(\text{electrode}) - n(\text{protect-electrode})| \leq 0.2 \tag{1}$$

$$0.2 \leq n(\text{protect-electrode}) - n(\text{protect-surface}) \tag{2}$$

In the expressions, the refractive index of the transparent electrode is defined as n(electrode), the refractive index of an interface on the transparent electrode side of the protective layer is defined as n(protect-electrode), and the refractive index of an interface, on the side opposite to the transparent substrate, of the protective layer is defined as n(protect-surface).

The protective layer in the touch panel member of the present invention is a protective layer provided so as to cover the transparent electrode and having a thickness of 0.04 to 10 µm, at least part of the protective layer having a refractive index that decreases continuously from the transparent substrate side toward the side opposite to the transparent substrate.

The transparent electrode may be formed on a transparent substrate, as desired, in any wiring pattern shape, and in many cases its cross sectional shape is a trapezoidal shape that is wider on the transparent substrate side.

The protective layer may be provided so as to cover at least part of the transparent electrode formed into the wiring pattern shape.

Furthermore, it is preferable that the pencil hardness of the protective layer is a hardness of B or higher.

The pencil hardness is measured in accordance with JIS K5600-5-4 using a Uni manufactured by Mitsubishi Pencil Co., Ltd. under conditions of a load of 750 gw, an angle of 45°, a speed of 0.1 cm/sec, and a temperature of 25° C.

From the viewpoint of prevention of framework visibility and planarization, the thickness of the protective layer is 0.04 to 10 μm, preferably 0.5 to 6.0 μm, and more preferably 1.0 to 5.0 μm.

The number of layers of the protective layer may be one layer or two or more layers as long as at least one layer is a layer for which the refractive index decreases continuously from the transparent substrate side toward the side opposite to the transparent substrate. From the viewpoint of ease of production, it is preferably no greater than ten layers, and more preferably no greater than five layers.

From the viewpoint of planarity and film thickness stability, the thickness of each layer is preferably 0.02 to 5 μm, more preferably 0.04 to 4.0 μm, and particularly preferably 0.05 to 3.0 μm.

In particular, a layer comprising only an inorganic material is preferably 0.02 to 1.0 μm, more preferably 0.03 to 0.6 μm, and particularly preferably 0.04 to 0.5 μm.

The protective layer is preferably transparent.

The transmittance of the entire protective layer for light having a wavelength of 400 nm is preferably at least 80%, more preferably at least 85%, and most preferably at least 90%.

From the viewpoint of prevention of framework visibility, prevention of taper visibility, and reduction of total reflection, the protective layer in the touch panel member of the present invention comprises, in at least one part thereof, a region in which the refractive index decreases continuously from the transparent substrate side toward the side opposite to the transparent substrate.

The refractive index decreasing continuously means that there is no clear interface from the viewpoint of refractive index and it decreases gradually. The protective layer in the touch panel member of the present invention comprises such a region in at least part thereof.

In the protective layer, the region where the refractive index decreases continuously is preferably the entire protective layer or at least one layer when the protective layer is formed from two or more layers.

Furthermore, the region where the refractive index decreases continuously preferably has a thickness of at least 20 nm in the thickness direction of the protective layer, more preferably has a thickness of at least 40 nm, and particularly preferably has a thickness of at least 60 nm. The upper limit of the thickness is the thickness of the protective layer.

The protective layer in the touch panel member of the present invention satisfies Expression 1 below.

$$|n(\text{electrode}) - n(\text{protect-electrode})| \leq 0.2 \quad (1)$$

In the expression, the refractive index of the transparent electrode is defined as n(electrode), and the refractive index of the interface on the transparent electrode side of the protective layer is defined as n(protect-electrode).

Expression 1 expresses the absolute value of the difference in refractive index between the transparent electrode and the interface on the transparent electrode side of the protective layer.

From the viewpoint of prevention of total reflection, prevention of framework visibility, and prevention of taper visibility, the absolute value of the difference in refractive index between the transparent electrode and the interface on the transparent electrode side in the protective layer is no greater than 0.2, preferably no greater than 0.15, and more preferably no greater than 0.10.

Furthermore, from the viewpoint of production suitability, it is preferable that $0 \leq n(\text{electrode}) - n(\text{protect-electrode}) \leq 0.2$. That is, the refractive index of the interface on the transparent electrode side in the protective layer is preferably the same as or smaller than the refractive index of the transparent electrode.

In the present invention, the refractive index of the transparent electrode interface of the protective layer means the value of the refractive index of the face of the protective layer that is in contact with the transparent electrode when it can be measured unambiguously and the value of the average refractive index of a region having a film thickness of 3 nm in the immediate vicinity of the transparent electrode of the protective layer when the refractive index of the face of the protective layer that is in contact with the transparent electrode cannot be measured unambiguously.

The protective layer in the touch panel member of the present invention satisfies Expression 2 below.

$$0.2 \leq n(\text{protect-electrode}) - n(\text{protect-surface}) \quad (2)$$

In the expression, the refractive index of the interface on the transparent electrode side of the protective layer is defined as n(protect-electrode), and the refractive index of the interface, on the side opposite to the transparent substrate, of the protective layer is defined as n(protect-surface).

Expression 2 expresses the difference in refractive index between the protective layer interface on the transparent electrode side and the interface on the side opposite to the transparent substrate.

From the viewpoint of prevention of total reflection, prevention of framework visibility, and prevention of taper visibility, the difference in refractive index between the protective layer interface on the transparent electrode side and the interface on the side opposite to the transparent substrate is at least 0.2, preferably at least 0.25, and more preferably at least 0.3.

The upper limit is not limited as long as Expression 1 and Expression 2 are satisfied, but from the viewpoint of prevention of total reflection, prevention of framework visibility, and prevention of taper visibility, the upper limit is preferably |n(electrode)−n(adjacent)|. Furthermore, from the viewpoint of ease of production, the upper limit is preferably no greater than 0.70, and more preferably no greater than 0.60.

In the present invention, the refractive index of the protective layer interface on the side opposite to the transparent electrode means the value of the refractive index of the surface, on the side opposite to the transparent electrode, of the protective layer when it can be measured unambiguously and the value of the average refractive index of a region having a film thickness of 3 nm in the vicinity of the outermost surface, on the side opposite to the transparent electrode, of the protective layer when the refractive index of the surface, on the side opposite to the transparent electrode, of the protective layer cannot be measured unambiguously.

The protective layer in the touch panel member of the present invention preferably further satisfies Expression 3 below.

$$0 \le \Delta n \le 0.15 \quad (3)$$

In the expression, Δn denotes the amount of change in the refractive index of the protective layer from a given position of the protective layer to a position moved by 20 nm in the transparent substrate direction along a direction perpendicular to the plane of the transparent substrate on which the transparent electrode is provided.

Expression 3 shows that, in the protective layer, the change Δn of the refractive index in the direction perpendicular to the plane of the transparent substrate on which the transparent electrode is provided is gentle.

The change Δn of the refractive index is preferably at least 0 but no greater than 0.15, and more preferably greater than 0 but less than 0.15.

Δn denotes the difference in refractive index between respective points measured for a layer that includes a start point and an end point and in which the refractive index changes gradually.

Furthermore, in the touch panel member of the present invention, when there is an adjacent layer that is in contact with the interface on the side opposite to the transparent substrate of the protective layer, it is preferable that Expression 4 below is satisfied.

$$|n(\text{protect-surface}) - n(\text{adjacent})| \le 0.2 \quad (4)$$

In the expression, n(adjacent) denotes the refractive index of the adjacent layer.

Expression 4 expresses the absolute value of the difference in refractive index between the interface, on the side opposite to the transparent substrate, of the protective layer and an adjacent layer that is in contact therewith.

From the viewpoint of prevention of total reflection, the absolute value of the difference in refractive index between the interface, on the side opposite to the transparent substrate, of the protective layer and an adjacent layer that is in contact therewith is preferably no greater than 0.2, more preferably no greater than 0.15, and particularly preferably no greater than 0.10.

Furthermore, from the viewpoint of production suitability, it is preferable that 0≤n(protect-surface)−n(adjacent)≤0.2.

The material and method for formation of the protective layer in the touch panel member of the present invention are not particularly limited.

With regard to the material for the protective layer, it may be an organic material, an inorganic material, or an organic/inorganic mixed material.

As a method for forming the protective layer, it may be formed by a coating method, a sputtering method, a vapor deposition method, etc., two or more layers may be formed simultaneously by a multilayer coating method, or it may be formed by transfer using a transfer material, but it is preferable for it to be formed using at least a method for formation of a gradient layer, which is described later.

The material for the protective layer is not particularly limited, and the protective layer may be formed using a composition comprising a polymer, a refractive index-adjusting agent, a crosslinking agent, a photosensitizing agent, and/or another additive.

From the viewpoint of ease of adjustment of physical properties and formation of a layer, the protective layer preferably comprises a polymer and a refractive index-adjusting agent.

The protective layer are preferably a layer comprising an inorganic material and an organic material, more preferably layers comprising an inorganic material and a polymer, particularly preferably layers comprising an inorganic material and/or a metal alkoxide condensation product and a polymer, particularly preferably layers comprising inorganic particles and/or a metal alkoxide condensation product and a polymer, and most preferably layers comprising titanium oxide particles, zirconium oxide particles, and/or titanium-zirconium composite oxide particles and a polymer. With this embodiment, layer formation is easy, and film physical properties are excellent.

The inorganic material and/or the metal alkoxide condensation product are preferably a metal oxide and/or a metal alkoxide condensation product, and more preferably titanium oxide, zirconium oxide, a titanium-zirconium composite oxide, a titanoxane, a zirconoxane, and/or a titanoxane-zirconoxane condensation product.

—Polymer—

The polymer that can be used in the present invention is not particularly limited; a known resin that is used in a resist or a cured material thereof may preferably be used, and an acrylic polymer, a siloxane-based polymer, a polybenzoxazole-based polymer, a polyimide-based polymer, an alicyclic olefin-based polymer, etc. may desirably be used.

With regard to the polymer, one type may be used on its own or two or more types may be used in combination.

The polymer in the protective layer is preferably a polymer obtained by curing a composition for formation of a protective layer, which is described later.

The acrylic polymer may be a polymer formed by polymerization using a (meth)acrylic compound at 50 mole % or greater of total monomers; a known acrylic polymer may be used, and examples include a polymer having a constituent unit having an acid group protected with an acid-decomposable group, which is described later, an alkali soluble resin, and a resin formed by curing the above.

The siloxane-based polymer is not particularly limited, and a known siloxane-based polymer may be used.

Examples of the siloxane-based polymer include a polysiloxane formed by a synthesis involving hydrolysis-condensation of one or more types of organosilane represented by Formula S-1 and/or one or more types of organosilane represented by Formula S-2.

(S-1)

With regard to the organosilane represented by Formula S-1, the $R^{S1}$s independently denote a hydrogen atom, an alkyl group having 1 to 10 carbons, an alkenyl group having 2 to 10 carbons, or an aryl group having 6 to 15 carbons, and the plurality of $R^{S1}$s may be identical to or different from each other. Any of the alkyl group, alkenyl group, and aryl group may be either unsubstituted or substituted, and may be selected according to the properties of the composition.

The $R^{S2}$s in Formula S-1 independently denote a hydrogen atom, an alkyl group having 1 to 6 carbons, an acyl group having 2 to 6 carbons, or an aryl group having 6 to 15 carbons, and the plurality of $R^{S2}$s may be identical to or different from each other. Furthermore, any of the alkyl group, acyl group, and aryl group may be either unsubstituted or substituted, and may be selected according to the properties of the composition.

p in Formula S-1 denotes an integer of 1 to 3.

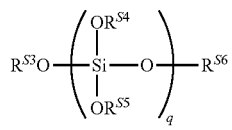
(S-2)

With regard to the organosilane represented by Formula S-2, $R^{S3}$ to $R^{S6}$ independently denote a hydrogen atom, an alkyl group having 1 to 6 carbons, an acyl group having 2 to 6 carbons, or an aryl group having 6 to 15 carbons. Any of the alkyl group, acyl group, and aryl group may be either unsubstituted or substituted, and may be selected according to the properties of the composition. Specific examples of the alkyl group include a methyl group, an ethyl group, an n-propyl group, an isopropyl group, and an n-butyl group. Specific examples of the acyl group include an acetyl group. Specific examples of the aryl group include a phenyl group.

q in Formula S-2 denotes an integer of 1 to 8.

As the siloxane-based polymer, a polysiloxane described in paragraphs 0044 to 0058 of International Laid-open Patent No. 2012/029734, a polysiloxane described in paragraphs 0022 to 0082 of International Laid-open Patent No. 2012/127964, and a polysiloxane described in paragraphs 0043 to 0117 of JP-A-2014-115438 may be used.

The polybenzoxazole-based polymer is not particularly limited, and a known polybenzoxazole-based polymer may be used.

As the polybenzoxazole-based polymer, a polybenzoxazole precursor comprising a constituent unit represented by Formula Z-1 below and a ring-closed derivative thereof may be used.

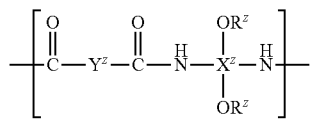
(Z-1)

$X^z$ denotes a tetravalent organic group, $Y^z$ denotes a divalent organic group, and the $R^z$s independently denote a hydrogen atom, an alkyl group, a group protected by an acetal structure, or a group represented by $-COR^c$. $R^c$ denotes an alkyl group or an aryl group.

The tetravalent organic group denoted by $X^z$ is preferably a tetravalent aliphatic hydrocarbon group, a tetravalent aromatic hydrocarbon group, or a group formed by bonding two or more structures selected from the group consisting of a di- or higher-valent aliphatic hydrocarbon group, a di- or higher-valent aromatic hydrocarbon group, —O—, —S—, —SO$_2$—, —CO—, and —NHCO—. These groups may optionally have a substituent such as a halogen atom.

The number of carbons of $X^z$ is preferably 6 to 50, and more preferably 6 to 30.

$X^z$ is preferably a tetravalent organic group having at least an aromatic ring.

The divalent organic group denoted by $Y^z$ is preferably a divalent aliphatic hydrocarbon group, a divalent aromatic hydrocarbon group, or a group formed by bonding two or more structures selected from the group consisting of a divalent aliphatic hydrocarbon group, a divalent aromatic hydrocarbon group, —O—, —S—, —SO$_2$—, —CO—, and —NHCO—. These groups may optionally have a substituent such as a halogen atom.

The number of carbons of $Y^z$ is preferably 2 to 50, and more preferably 3 to 20.

$Y^z$ is preferably a divalent aliphatic hydrocarbon group.

As the polybenzoxazole-based polymer, a polymer described in paragraphs 0014 to 0064 of JP-A-2008-224970 may be used.

Furthermore, the polybenzoxazole precursor is preferably a compound having a constituent repeating unit represented by Formula Z-1-1 below and a constituent repeating unit represented by Formula Z-1-2 below, and more preferably a compound having 50 mass % or greater of a constituent repeating unit represented by Formula Z-1-1 below and a constituent repeating unit represented by Formula Z-1-2 below.

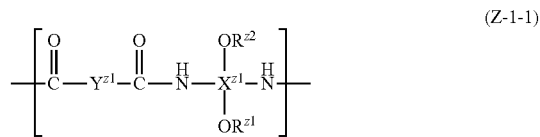
(Z-1-1)

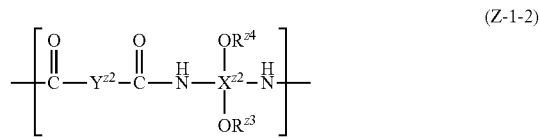
(Z-1-2)

In Formula Z-1-1 and Formula Z-1-2, $X^{z1}$ and $X^{z2}$ independently denote a tetravalent organic group, $R^{z1}$ to $R^{z4}$ independently denote a hydrogen atom, an alkyl group, an acid-decomposable group, or a group represented by $-COR^c$, at least one of $R^{z1}$ to $R^{z4}$ denotes a hydrogen atom or an acid-decomposable group, $R^c$ denotes an alkyl group or an aryl group, $Y^{z1}$ denotes a straight-chain or branched divalent aliphatic hydrocarbon group having 3 to 15 carbons, and $Y^{z2}$ denotes a cyclic divalent aliphatic hydrocarbon group having 4 to 20 carbons.

Preferred embodiments of $X^{z1}$ and $X^{z2}$ in Formula Z-1-1 and Formula Z-1-2 are independently the same as preferred embodiments of $X^z$ in Formula Z-1.

Preferred examples of $Y^{z1}$ include a propylene group, a butylene group, a hexylene group, and an octylene group.

Preferred examples of $Y^{z2}$ include a cyclohexylene group and an adamantylene group.

$X^{z1}$ and $X^{z2}$ are preferably independently a group represented by any of Formula X-1 to Formula X-4 below.

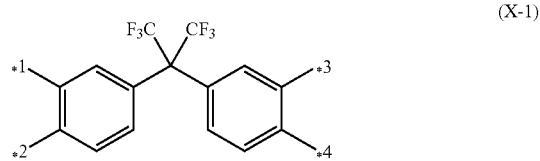
(X-1)

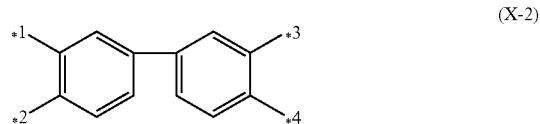
(X-2)

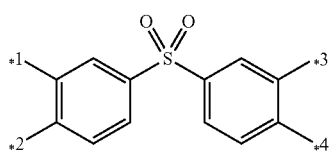

(X-3)

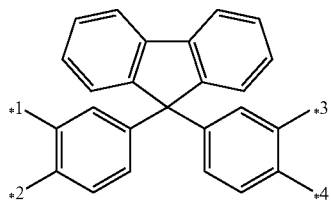

(X-4)

In Formula X-1 to Formula X-4, either one of *1 and *2 denotes a position bonded to —$OR^{z1}$ or —$OR^{z3}$, the other denoting a position bonded to a polymer main chain, and either one of *3 and *4 denotes a position bonded to —$OR^{z2}$ or —$OR^{z4}$, the other denoting a position bonded to a polymer main chain.

In the polybenzoxazole precursor, the ratio of the constituent repeating unit represented by Formula Z-1-1 and the constituent repeating unit represented by Formula Z-1-2 is preferably 9:1 to 3:7 as a molar ratio.

The polymer may be for example a composition itself for formation of a protective layer, which is described later, one that has been dried, or one that has been cured and thermally treated, but is preferably a resin formed by curing a composition for formation of a protective layer, which is described later, and more preferably a resin formed by curing and further thermally treating a composition for formation of a protective layer, which is described later.

The content of the polymer in the protective layer or in each layer of the protective layer is preferably 20 to 85 mass %, more preferably 30 to 80 mass %, and yet more preferably 35 to 60 mass %. When in this range, the transparency and strength are excellent.

Furthermore, when a condensation product of a metal alkoxide compound such as a titanoxane, a zirconoxane, and/or a titanoxane-zirconoxane condensation product, which are described later, and/or inorganic particles are contained, the total content of the metal alkoxide compound condensation product, inorganic particles, and polymer in the protective layer is preferably 20 to 100 mass %, more preferably 30 to 100 mass %, and yet more preferably 35 to 100 mass %. When in this range, the transparency and strength are excellent.

—Refractive Index-Adjusting Agent—

The protective layer preferably comprises a refractive index-adjusting agent.

The layer having a refractive index that decreases continuously from the transparent substrate side toward the side opposite to the transparent substrate in the protective layer is preferably a layer that the content of a refractive index-adjusting agent decreases continuously from the transparent substrate side toward the side opposite to the transparent substrate.

The refractive index-adjusting agent is not particularly limited, and may be an inorganic compound or an organic compound, but is preferably an inorganic oxide and/or a condensation product of a metal alkoxide compound, more preferably a metal oxide and/or a condensation product of a metal alkoxide compound, and particularly preferably metal oxide particles and/or a condensation product of a metal alkoxide compound.

Moreover, preferred examples of the refractive index-adjusting agent include a fluorene compound, which is described later.

The inorganic oxide and/or the condensation product of a metal alkoxide compound are preferably compounds selected from the group consisting of a titanoxane, a zirconoxane, a titanoxane-zirconoxane condensation product, titanium oxide, zirconium oxide, and a titanium-zirconium composite oxide, and more preferably compounds selected from the group consisting of a titanoxane, a zirconoxane, a titanoxane-zirconoxane condensation product, titanium oxide particles, zirconium oxide particles, and titanium-zirconium composite oxide particles.

The condensation product of a metal alkoxide compound is preferably a condensation product formed from a composition comprising a1 and/or a2 below.

Furthermore, the inorganic oxide is preferably a3 below.

a1: alkoxy group-containing titanium compound and/or zirconium compound, a2: titanoxane, zirconoxane and/or titanoxane-zirconoxane condensation product comprising at least one alkoxy group directly bonded to titanium atom or zirconium atom, a3: titanium atom- and/or zirconium atom-containing metal oxide.

The protective layer may comprise one type of refractive index-adjusting agent on its own or may comprise two or more types.

When the protective layer comprises a1 above, it preferably simultaneously comprises a component corresponding to a2 that is a condensate of said a1.

Among them, the protective layer preferably comprises a3, more preferably comprises titanium oxide particles, zirconium oxide particles, and/or titanium atom- and/or zirconium atom-containing composite oxide particles, and yet more preferably comprises titanium oxide particles. With this embodiment, the transmittance is higher, and the crack resistance is better.

The content (mass content) of the refractive index-adjusting agent, in particular a1 to a3, in the protective layer is preferably 10 to 80 mass %, more preferably 15 to 70 mass %, and yet more preferably 20 to 65 mass %. When in this range, the transparency and strength are excellent.

The protective layer is preferably a layer that the content of a1 to a3 decreases from the transparent substrate side toward the side opposite to the transparent substrate, and is more preferably a layer that the content of a3 decreases from the transparent substrate side toward the side opposite to the transparent substrate. With this embodiment, adjustment of the refractive index of the protective layer is easy.

a1 to a3 is preferably selected from the group consisting of a titanium compound, a titanoxane, and titanium oxide from the viewpoint of cost and refractive index, or is preferably selected from the group consisting of a zirconium compound, a zirconoxane, and zirconium oxide from the viewpoint of low temperature curability, cure rate, and stability.

a1: alkoxy group-containing titanium compound and/or zirconium compound

Examples of a1: alkoxy group-containing titanium compound and alkoxy group-containing zirconium compound include a titanium monoalkoxide, a titanium dialkoxide, a titanium trialkoxide, a titanium tetraalkoxide, a zirconium monoalkoxide, a zirconium dialkoxide, a zirconium trialkoxide, and a zirconium tetraalkoxide. Among them a titanium tetraalkoxide and a zirconium tetraalkoxide are preferable.

The titanium tetraalkoxide is preferably a titanium tetraalkoxide represented by Formula a1-1 below from the viewpoint of film physical properties.

The zirconium tetraalkoxide is preferably a zirconium tetraalkoxide represented by Formula a1-2 below from the viewpoint of film physical properties.

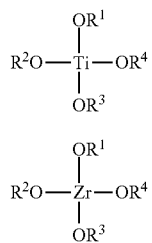

In Formula a1-1 and Formula a1-2, $R^1$ to $R^4$ independently denote an alkyl group having 1 to 18 carbons, an aryl group having 6 to 18 carbons, or an aralkyl group having 7 to 18 carbons.

Examples of the titanium tetraalkoxide represented by Formula a1-1 include titanium tetramethoxide, titanium tetraethoxide, titanium tetra-n-propoxide, titanium tetraisopropoxide, titanium tetra-n-butoxide, titanium tetraisobutoxide, titanium diisopropoxydi-n-butoxide, titanium di-t-butoxydiisopropoxide, titanium tetra-t-butoxide, titanium tetraisooctyloxide, and a titanium tetrastearylalkoxide.

Specific examples of the zirconium tetraalkoxide represented by Formula a1-2 include, but are not limited to, zirconium tetramethoxide, zirconium tetraethoxide, zirconium tetra-n-propoxide, zirconium tetraisopropoxide, zirconium tetra-n-butoxide, zirconium tetraisobutoxide, zirconium diisopropoxydi-n-butoxide, zirconium di-t-butoxydiisopropoxide, zirconium tetra-t-butoxide, zirconium tetraisooctyloxide, and a zirconium tetrastearylalkoxide.

a2: titanoxane, zirconoxane, and/or titanoxane-zirconoxane condensation product having at least one alkoxy group directly connected to titanium atom or zirconium atom The titanoxane is also called a polytitanoxane and is a compound having two or more Ti—O—Ti bonds.

The zirconoxane is also called a polyzirconoxane and is a compound having two or more Zr—O—Zr bonds.

The titanoxane is preferably a titanoxane represented by Formula a2-1 below from the viewpoint of film physical properties.

Furthermore, the zirconoxane is preferably a zirconoxane represented by Formula a2-2 below from the viewpoint of film physical properties.

$$Ti_\alpha O_\beta (OR)_\gamma \quad (a2\text{-}1)$$

$$Zr_\alpha O_\beta (OR)_\gamma \quad (a2\text{-}2)$$

In Formula a2-1 and Formula a2-2, the Rs independently denote a hydrogen atom, an alkyl group having 1 to 18 carbons, an aryl group having 6 to 18 carbons, or an aralkyl group having 7 to 18 carbons, $\alpha$, $\beta$, and $\gamma$ satisfy conditions a' to c' below, a denotes a positive integer, and $\beta$ and $\gamma$ denote a positive number.

a': $200 \geq \alpha \geq 2$,
b': $1.9\alpha \geq \beta \geq 1.0\alpha$,
c': $\gamma = 4\alpha - 2\beta$ The titanoxane, zirconoxane, and titanoxane-zirconoxane condensation product denoted by a2 may be one having a single formula or a mixture of two or more types.

a3: titanium atom- and/or zirconium atom-containing metal oxide

The titanium atom- and/or zirconium atom-containing composite oxide is preferably titanium oxide, a titanium composite oxide, zirconium oxide, or a zirconium composite oxide, more preferably titanium oxide, a titanium composite oxide, or zirconium oxide, yet more preferably titanium oxide or zirconium oxide, and particularly preferably titanium oxide.

The titanium oxide is particularly preferably a rutile type, which has a high refractive index.

Furthermore, a3 preferably comprises metal oxide particles.

As a3, commercial products may be used, and examples include, as titanium oxide particles, the TTO series (TTO-51 (A), TTO-51 (C), etc.), TTO-S, and the V series (TTO-S-1, TTO-S-2, TTO-V-3, etc.) manufactured by Ishihara Sangyo Kaisha Ltd., the MT series manufactured by Tayca Corporation (MT-01, MT-05, etc.), as tin oxide-titanium oxide composite particles Optolake TR-502 and Optolake TR-504 (both from JGC C & C), as silicon oxide-titanium oxide composite particles Optolake TR-503, Optolake TR-513, Optolake TR-520, Optolake TR-521, and Optolake TR-527 (all from JGC C & C), zirconium oxide particles (Kojundo Chemical Laboratory Co., Ltd.), and tin oxide-zirconium oxide composite particles (JGC C & C).

Furthermore, a3 preferably comprises metal oxide particles.

From the viewpoint of transparency, the average primary particle size of a3 is preferably 1 to 200 nm, more preferably 3 to 80 nm, and particularly preferably 5 to 50 nm. The average primary particle size of particles referred to here means the arithmetic average of the particle size of any 200 particles measured using an electron microscope. When the shape of the particles is not spherical, the size corresponds to the longest side.

Moreover, a3 may be supplied for use as a dispersion prepared by mixing and dispersing in an appropriate dispersant and solvent using a mixer such as a ball mill or a rod mill.

The refractive index-adjusting agent is preferably a fluorene compound. Furthermore, a fluorene ring structure may be introduced into the organic resin by copolymerization of a monomer having a fluorene ring with a resin such as a polymer.

The organic resin preferably has a fluorene ring structure as described below. Due to it having a fluorene ring structure, the transparency becomes higher.

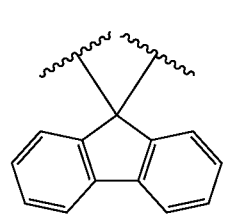 [SMILES: *C1(*)c2ccccc2-c2ccccc21]

The fluorene ring structure may have a substituent on the aromatic ring, and the substituents may be bonded to each other to form an alicyclic or aromatic ring.

Preferred examples of the substituent include a halogen atom, an alkyl group, an aryl group, an alkoxy group, an aryloxy group, an alkylthio group, and an arylthio group, more preferred examples include a halogen atom, an alkyl group, and an alkoxy group, and yet more preferred examples include an alkyl group The monomer having a fluorene ring preferably comprises a reactive group-containing fluorene compound below.

Preferred examples of the reactive group-containing fluorene compound include compounds represented by Formula I below.

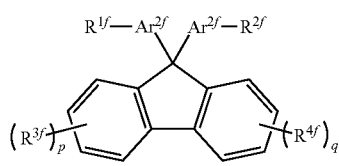

(I)

In Formula I, $Ar^{1f}$ and $Ar^{2f}$ independently denote an arylene group, $R^{1f}$ and $R^{2f}$ independently denote a hydroxy group, a carboxy group, an alkoxy group, or a monovalent organic group containing at least one type of group selected from the group consisting of a hydroxy group, a carboxy group, an epoxy group, and an oxetanyl group, at least one of $R^{1f}$ and $R^{2f}$ is a hydroxy group, a carboxy group, or a monovalent organic group containing at least one type of group selected from the group consisting of a hydroxy group, a carboxy group, an epoxy group, and an oxetanyl group, $R^{3f}$ and $R^{4f}$ independently denote a monovalent substituent, p and q independently denote an integer of 0 to 4, and different $R^{3f}$s and different $R^{4f}$s may be bonded to each other to form an alicyclic or aromatic ring.

Specific examples of the fluorene compound include a compound described in paragraph 0018 of Japanese registered patent No. 5186200, a compound described in paragraph 0011 of JP-A-4-325508, and a compound described in paragraphs 0025 to 0049 of International Laid-open Patent No. 2014/199967.

With regard to the fluorene compound, one type may be used on its own or two or more types may be used in combination.

The content of the fluorene compound in the protective layer is preferably 0.1 to 40 mass %, more preferably 0.5 to 30 mass %, and yet more preferably 1 to 20 mass %. When in this range, the transparency and strength are excellent.

The protective layer may comprise another additive in addition to the above components. Examples of the other additive include those known as an additive for a resist or a photosensitive composition.

<Method for Forming Refractive Index Gradient in Protective Layer>

A method for forming a layer whose refractive index decreases continuously from the transparent substrate side toward the side opposite to the transparent substrate, that is, a layer having a refractive index gradient, is not particularly limited, and a known method may be employed.

For example, methods described in (1) to (4) below may be suitably cited.

(1) Method in which Reaction with Substance Adjacent to Interface is Carried Out There can be cited as a suitable example a method in which a film is formed using a reactive material, and a reaction with a substance that is adjacent to an interface (surface) of the film is carried out to thus give a change in the formulation between that at the film surface and that in the film interior.

Specific examples include a method as described in Japanese registered patent No. 4932986 in which a film is formed using a mixed composition of an organic polymer and a titanium alkoxide, and a film having a high proportion of the titanium alkoxide at the surface is formed by reaction with moisture in the air, and a method as described in Japanese registered patent No. 4130834 in which a film is formed using a polysilane, and a film having a high proportion of siloxane at the surface is formed by reaction with oxygen in the air.

(2) Method in which Reaction is Started from One Part of Film

Suitable examples include a method in which a film having a formulation that changes continuously is formed by making a curing reaction occur from one part of the film.

Specific examples include a method as described in Japanese registered patent No. 3444352 in which a mixed composition comprising a monomer having a large refractive index and a monomer having a small refractive index is used, and only the monomer having large refractive index is cured first, thus forming a film in which the formulation changes continuously.

(3) Method Involving Impregnation and Mixing

Suitable examples include a method in which a film having a formulation that changes continuously is formed by impregnating a formed film with another material via the film surface.

(4) Method in which Feed Material for Layer Formation is Changed Continuously

Suitable examples include a method in which a film having a formulation that changes continuously is formed by continuously changing the feed material for layer formation.

Specific examples include a method in which an ink formulation used is changed continuously when forming a film by inkjet coating and a method in which the target or the oxygen/nitrogen flow rate is changed continuously when forming a film by sputtering.

Furthermore, there can be cited as a suitable example a method in which, for example, two or more types of compositions for formation of protective layers having different refractive indices, which are described later, are prepared, and the mixing ratio of the compositions is changed continuously while carrying out inkjet coating.

Furthermore, an inorganic material may be used suitably for formation of a protective layer and formation of the layer having a refractive index gradient.

Examples of the inorganic material include an inorganic thin film layer comprising at least one element selected from the group consisting of Mg, Si, Al, In, Hf, Nb, Ce, Ti, and Ta and at least one element selected from the group consisting of O, N, C, and F.

Specific examples include $MgF_2$, $SiO_2$, $Al_2O_3$, $CeF_3$, $SiO$, $In_2O_3$, $HfO_2$, $ZrO_2$, $Pb_5O_{11}$, $TiO_2$, $Ta_2O_5$, $Nb_2O_5$, and nitrides of these metal elements.

With regard to a method for forming a film of an inorganic material, a film may be formed by a film formation method such as a vacuum vapor deposition method, a sputtering method, a CVD method, an ion plating method, or a spray method. The method may be appropriately selected according to the required film thickness, but from the viewpoint of suppressing variation in film thickness, a sputtering method is preferred.

For example, when producing a thin film layer having a formulation gradient and comprising the three elements Si, O, and N by means of a sputtering method, a method in which a silicon target is used, and sputtering is carried out while continuously changing the flow rate ratio of nitrogen and oxygen can be cited. In this process, it is preferable to carry out the method while monitoring the nitrogen and oxygen ratio in the film formation atmosphere. It is possible by controlling the conditions such as the flow rate of nitrogen or oxygen to change the formulation gradually and form a material having a refractive index gradient.

<Transparent Electrode>

The transparent electrode in the touch panel member of the present invention is an electrode for detecting touch and is formed above a transparent substrate.

The transmittance for light having a wavelength of 400 nm of the transparent electrode is preferably 80% or greater, more preferably 85% or greater, and particularly preferably 90% or greater.

From the viewpoint of resistance and transmittance, the film thickness of the transparent electrode is preferably 5 to 500 nm, more preferably 10 to 400 nm, and particularly preferably 30 to 300 nm.

From the viewpoint of prevention of total reflection, prevention of framework visibility, and prevention of taper visibility, the refractive index of the transparent electrode is preferably no greater than 2.40, more preferably no greater than 2.30, yet more preferably no greater than 2.20, and particularly preferably no greater than 2.10.

Furthermore, from the viewpoint of production stability and drive efficiency, the refractive index of the transparent electrode is preferably 1.76 or greater, more preferably 1.86 or greater, and yet more preferably 1.90 or greater.

From the viewpoint of drive efficiency, the surface resistivity of the transparent electrode is preferably 0.1 to 1,000 Ω/square, and more preferably 1 to 200 Ω/square.

From the viewpoint of production stability, the taper angle of a side face of the transparent electrode is preferably 2° to 80°, more preferably 5° to 70°, and particularly preferably 10° to 65°.

The taper angle of a side face of the transparent electrode in the present invention is defined as the angle formed between the side face of the transparent electrode and the face of the transparent substrate on which the transparent electrode is provided. For example, a taper angle of 90° means that the side face of the transparent electrode is perpendicular to the face of the transparent substrate on which the transparent electrode is provided.

The material of the transparent electrode is not particularly limited as long as the performance as a transparent electrode can be satisfied, and a known material may be used.

The transparent electrode is a layer that has transmittance in the visible light region and has conductivity.

As a method for forming the transparent electrode, any conventionally known technique such as a vacuum vapor deposition method, a sputtering method, or an ion plating method may be used, but from the viewpoint of film uniformity and adhesion of a thin film to a transparent substrate, formation of a thin film by a sputtering method is preferable. It is also possible to form a transparent electrode having a desired shape from a thin film by a known method such as masking or etching.

A thin film material used is not particularly limited, and preferred examples include a metal oxide such as a tin oxide-containing indium oxide or an antimony-containing tin oxide as well as gold, silver, platinum, palladium, copper, aluminum, nickel, chromium, titanium, cobalt, tin, zinc, and an alloy thereof.

Specific examples include zinc oxide (ZnO), GZO (Ga-doped ZnO), AZO (Al-doped ZnO), silver, ITO (indium tin oxide), and IZO (indium zinc oxide). Among them, ITO or IZO is preferable.

<Transparent Substrate>

The transparent substrate for the touch panel member of the present invention is not particularly limited as long as a substrate is transparent.

Examples of the substrate include an inorganic substrate, a resin substrate, and a resin composite material substrate.

Examples of the inorganic substrate include glass, quartz, silicon, silicon nitride, and a composite substrate formed by vapor deposition of molybdenum, titanium, aluminum, copper, etc. on such a substrate.

Examples of the resin substrate include a substrate consisting of synthetic resins such as polybutylene terephthalate, polyethylene terephthalate, polyethylene naphthalate, polybutylene naphthalate, polystyrene, polycarbonate, polysulfone, polyether sulfone, polyallylate, an allyldiglycolcarbonate resin, polyamide, polyimide, polyamide-imide, polyetherimide, polybenzazole, polyphenylene sulfide, a polycycloolefin, a norbornene resin, a fluorine resin such as polychlorotrifluoroethylene, a liquid crystal polymer, an acrylic resin, an epoxy resin, a silicone resin, an ionomer resin, a cyanate resin, a crosslinked fumaric acid diester, a cyclic polyolefin, an aromatic ether resin, a maleimide-olefin copolymer, cellulose, and an episulfide resin.

These transparent substrates are not often used in their 'as is' configuration, and are usually formed into a multilayer structure such as for example in a thin film transistor (TFT) device according to the configuration of the final product.

Among them, a polyester film or a glass substrate is preferable, and a polyethylene terephthalate (PET) film or a glass substrate is more preferable.

The thickness of the transparent substrate is not particularly limited but is preferably 0.5 μm to 2 mm.

<Adjacent Layer>

The touch panel member of the present invention may comprise an adjacent layer that is adjacent to the protective layer (the Nth layer) on the side opposite to the transparent substrate.

The adjacent layer is not particularly limited, and preferred examples include a pressure-sensitive adhesion layer.

Furthermore, the touch panel member of the present invention may not have an adjacent layer, and in this case the Nth layer is in contact with air.

Preferred examples of the pressure-sensitive adhesion layer include a tacky layer for laminating a protective layer-equipped transparent electrode substrate (the touch panel member of the present invention that has no adjacent layer) on a polarizing plate, a cover substrate, a display device, etc.

From the viewpoint of a decrease in total reflection, the refractive index of the pressure-sensitive adhesion layer is preferably 1.35 to 1.65, and more preferably 1.40 to 1.60.

The touch panel member of the present invention may comprise a known layer other than the transparent substrate, the transparent electrode, the protective layer, and the adjacent layer. Examples include a protective layer, an insulating layer, an adhesion layer, and a pressure-sensitive adhesion layer that is other than the above adjacent layer.

The touch panel member of the present invention is explained further by means of a drawing.

FIG. 1 is a conceptual sectional view showing one example of the touch panel member of the present invention.

A touch panel member 10 shown in FIG. 1 comprises a plurality of transparent electrodes 14 having a trapezoidal cross sectional shape above a transparent substrate 12, and a protective layer 16 is provided so as to cover the transparent electrodes 14.

The protective layer 16 is a layer whose refractive index decreases continuously from the transparent substrate side toward the side opposite to the transparent substrate.

The absolute value of the difference in refractive index between the transparent electrode 14 and an interface 16a on the transparent electrode side of the protective layer 16 is no greater than 0.20.

Furthermore, the difference in refractive index between the interface 16a on the transparent electrode side of the protective layer 16 and an interface 16b, on the side opposite to the transparent substrate, of the protective layer 16 is at least 0.20.

Moreover, the protective layer 16 may further comprise an adjacent layer 18.

{Composition for Formation of Protective Layer}

At least one of the protective layer of the touch panel member of the present invention is preferably formed using a composition for formation of a protective layer. The composition is preferably used for formation of a layer having a refractive index gradient.

The composition for formation of a protective layer is preferably a curable composition.

The composition for formation of a protective layer is preferably a photosensitive composition, and more preferably a positive-working photosensitive composition or a negative-working photosensitive composition.

Component A: At Least One Type Selected from the Group Consisting of a1 to a3

The composition for formation of a protective layer comprises as Component A at least one type selected from the group consisting of a1 to a3 below.

a1: an alkoxy group-containing titanium compound and/or zirconium compound, a2: a titanoxane, zirconoxane and/or titanoxane-zirconoxane condensation product having at least one alkoxy group directly connected to a titanium atom or a zirconium atom, a3: a titanium atom- and/or zirconium atom-containing metal oxide.

Preferred embodiments of Component A are the same as those of Component A described above.

The content of Component A is preferably 15 to 80 mass % relative to the total solids content of the photosensitive composition, more preferably 20 to 70 mass %, and yet more preferably 40 to 65 mass %. The 'solids content' in the photosensitive composition denotes components excluding volatile components such as solvent. Needless to say the solids content may be not only for a solid but also for a liquid.

Component B: Polymer

The composition for formation of a protective layer preferably comprises a polymer.

The resin is not particularly limited, and a known resin used as a resist may preferably be used.

With regard to the polymer, one type thereof may be used on its own or two or more types may be contained.

When the composition for formation of a protective layer is a positive-working photosensitive composition, the polymer preferably comprises a polymer having a constituent unit containing a group formed from an acid group protected by an acid-decomposable group.

In the present invention, the 'constituent unit containing a group formed from an acid group protected by an acid-decomposable group' is also called 'constituent unit b1'.

Furthermore, when the composition for formation of a protective layer is a negative-working photosensitive composition, the polymer preferably comprises an alkali-soluble resin.

—Polymer Having Constituent Unit Containing Group that is Formed from Acid Group Protected by Acid-Decomposable Group—

The composition for formation of a protective layer preferably comprises a polymer having a constituent unit containing a group formed from an acid group protected by an acid-decomposable group (hereinafter, also called 'Component B-1').

The composition for formation of a protective layer may comprise a polymer other than the polymer having a constituent unit containing a group formed from an acid group protected by an acid-decomposable group.

Component B-1 is preferably an addition-polymerization type resin, and more preferably a polymer containing a constituent unit derived from (meth)acrylic acid and/or an ester thereof (acrylic resin). It may have a constituent unit other than a constituent unit derived from (meth)acrylic acid and/or an ester thereof, for example, a styrene-derived constituent unit or a vinyl compound-derived constituent unit.

Component B-1 is a polymer having at least constituent unit b1 containing a group formed from an acid group protected by an acid-decomposable group. Due to Component B-1 comprising a polymer having constituent unit b1, a very high sensitivity photosensitive composition can be obtained.

With regard to the 'group formed from an acid group protected by an acid-decomposable group' in the present invention, a known acid group and acid-decomposable group may be used and are not particularly limited. Specific preferred examples of the acid group include a carboxyl group and a phenolic hydroxy group. As the acid-decomposable group, a group that is relatively easily decomposed by an acid (for example, an acetal-based functional group such as an acetal structure, a ketal structure, a tetrahydropyranyl ester group, or a tetrahydrofuranyl ester group) or a group that is relatively difficultly decomposed by an acid (for example, a tertiary alkyl group such as a tert-butyl ester group or a tertiary alkyl carbonate group such as a tert-butyl carbonate group) may be used.

The constituent unit b1 containing a group formed from an acid group protected by an acid-decomposable group is preferably a constituent unit containing a protected carboxyl group formed from a carboxyl group protected by an acid-decomposable group (also called a 'constituent unit containing a protected carboxyl group protected by an acid-decomposable group') or a constituent unit containing a protected phenolic hydroxy group formed from a phenolic hydroxy group protected by an acid-decomposable group (also called a 'constituent unit containing a protected phenolic hydroxy group protected by an acid-decomposable group').

Preferred examples of the acid-decomposable group include a 1-ethoxyethyl group, a 1-butoxyethyl group, a 1-benzyloxyethyl group, a 1-cyclohexyloxyethyl group, a tetrahydrofuranyl group, and a tetrahydropyranyl group.

It is preferable for Component B-1 to comprise a crosslinkable group, and it is more preferable for it to comprise a constituent unit containing a crosslinkable group.

The crosslinkable group is not particularly limited as long as it is a group that undergoes a curing reaction by a thermal treatment.

The crosslinkable group is preferably an epoxy group, an oxetanyl group, a group represented by —NH—CH$_2$—

O—R (R denotes a hydrogen atom or an alkyl group having 1 to 20 carbons), or an ethylenically unsaturated group, and is more preferably an epoxy group or an oxetanyl group.

Specific examples of a monomer used in order to form a constituent unit containing an epoxy group include glycidyl acrylate, glycidyl methacrylate, glycidyl α-ethylacrylate, glycidyl α-n-propylacrylate, glycidyl α-n-butylacrylate, 3,4-epoxybutyl acrylate, 3,4-epoxybutyl methacrylate, 3,4-epoxycyclohexylmethyl acrylate, 3,4-epoxycyclohexylmethyl methacrylate, 3,4-epoxycyclohexylmethyl α-ethylacrylate, o-vinylbenzyl glycidyl ether, m-vinylbenzyl glycidyl ether, p-vinylbenzyl glycidyl ether, and alicyclic epoxy skeleton-containing compounds described in paragraphs 0031 to 0035 of Japanese registered patent No. 4168443.

Specific examples of a monomer used in order to form a constituent unit containing an oxetanyl group include oxetanyl group-containing (meth)acrylic acid esters described in paragraphs 0011 to 0016 of JP-A-2001-330953.

It is preferable for Component B-1 to comprise an acid group, and it is more preferable for it to comprise a constituent unit containing an acid group.

Examples of the acid group include a carboxylic acid group, a sulfonamide group, a phosphonic acid group, a sulfonic acid group, a phenolic hydroxy group, a sulfonamide group, a sulfonylimide group, an acid anhydride group of the above acid groups, and a group that is formed by neutralizing the above acid groups to form a salt structure; a carboxylic acid group and/or a phenolic hydroxy group are preferable. Preferred examples of the salt include, but are not particularly limited to, an alkali metal salt, an alkaline earth metal salt, and an organic ammonium salt.

The constituent unit containing an acid group is more preferably a constituent unit derived from a styrene compound, a constituent unit derived from a vinyl compound, or a constituent unit derived from (meth)acrylic acid and/or an ester thereof.

In the present invention, it is particularly preferable from the viewpoint of sensitivity for it to comprise a constituent unit containing a carboxyl group or a constituent unit containing a phenolic hydroxy group.

Specific examples of monomers used in the polymerization of Component B-1 include constituent units from styrene, tert-butoxystyrene, methylstyrene, α-methylstyrene, acetoxystyrene, methoxystyrene, ethoxystyrene, chlorostyrene, methyl vinylbenzoate, ethyl vinylbenzoate, methyl (meth)acrylate, ethyl (meth)acrylate, n-propyl (meth)acrylate, isopropyl (meth)acrylate, benzyl (meth)acrylate, isobornyl (meth)acrylate, acrylonitrile, and ethylene glycol monoacetoacetate mono(meth)acrylate. Examples other than the above include compounds described in paragraphs 0021 to 0024 of JP-A-2004-264623.

From the viewpoint of electrical characteristics, Component B-1 preferably comprises a constituent unit derived from a styrene or a monomer having an aliphatic ring skeleton, and more preferably comprises a constituent unit derived from a monomer having an aliphatic ring skeleton. Specific examples of these monomers include styrene, tert-butoxystyrene, methylstyrene, α-methylstyrene, dicyclopentanyl (meth)acrylate, cyclohexyl (meth)acrylate, isobornyl (meth)acrylate, benzyl (meth)acrylate, and dicyclopentanyl (meth)acrylate.

Furthermore, from the viewpoint of adhesion, Component B-1 is preferably a constituent unit derived from an alkyl (meth)acrylate ester. Specific examples of the alkyl (meth)acrylate ester include methyl (meth)acrylate, ethyl (meth)acrylate, propyl (meth)acrylate, and n-butyl (meth)acrylate; methyl (meth)acrylate is more preferable.

Constituent unit b1 is preferably 50 to 100 mole % relative to the total constituent units of Component B-1, more preferably 10 to 90 mole %, yet more preferably 10 to 60 mole %, and particularly preferably 20 to 50 mole %.

The constituent unit containing a crosslinkable group is preferably 5 to 90 mole % relative to the total constituent units of Component B-1, more preferably 10 to 80 mole %, and yet more preferably 10 to 60 mole %.

The constituent unit containing an acid group is preferably 1 to 80 mole % relative to the total constituent units of Component B-1, more preferably 1 to 50 mole %, yet more preferably 5 to 40 mole %, particularly preferably 5 to 30 mole %, and most preferably 5 to 20 mole %.

Constituent units other than the above are preferably no greater than 60 mole % relative to the total constituent units of Component B-1, more preferably no greater than 50 mole %, and yet more preferably no greater than 40 mole %. The lower limit value may be 0 mole %, but it is preferably for example at least 1 mole %, and more preferably at least 5 mole %.

In the present invention, when the content of a 'constituent unit' is defined on the basis of molar ratio, the 'constituent unit' has the same meaning as that of 'monomer unit'. The 'monomer unit' in the present invention may be modified after polymerization using a polymer reaction, etc.

The molecular weight of Component B-1 is preferably 1,000 to 200,000 as a weight-average molecular weight on a polystyrene basis, and more preferably 2,000 to 50,000. When within this numerical range, various properties are good. The ratio of number-average molecular weight Mn and weight-average molecular weight Mw (dispersity, Mw/Mn) is preferably 1.0 to 5.0, and more preferably 1.5 to 3.5.

Furthermore, as Component B-1, resins described in paragraphs 0016 to 0080 of JP-A-2014-132292 may suitably be used.

The content of Component B-1 in the positive-working photosensitive composition is preferably 20 to 99.9 mass % relative to the total solids content of the photosensitive composition, more preferably 50 to 98 mass %, and yet more preferably 70 to 95 mass %. When the content is in this range, pattern forming properties when developed are good, and a cured material having a higher refractive index is obtained.

—-Alkali-Soluble Resin—

From the viewpoint of resolution and film properties improvement, the composition for formation of a protective layer preferably comprises an alkali-soluble resin (hereinafter, also called 'Component B-2').

Component B-2 is not particularly limited, and a known alkali-soluble resin may be used.

A polar group that imparts alkali solubility to the alkali-soluble resin is not particularly limited, and it may comprise a known polar group; preferred examples include a carboxyl group, a hydroxy group, a phosphoric acid group, and a sulfonic acid group, and a carboxyl group is particularly preferable.

The binder polymer is preferably a linear organic polymer. As such a linear organic polymer, any known polymer may be used, but an acrylic resin is preferable. The linear organic polymer may not only be used as a film-forming agent but may also be selected according to the intended application with a developing compound in using an aqueous, weakly alkaline aqueous, or organic solvent type developer. For example, when a water-soluble organic polymer is used, development with water becomes possible. Examples of such a linear organic polymer include a radical polymer containing a carboxylic acid group in a side chain such as those described in JP-A-59-44615, JP-B-54-34327 (JP-B denotes a Japanese examined patent application publication), JP-B-58-12577, JP-B-54-25957, JP-A-54-92723, JP-A-59-53836, and JP-A-59-71048, that is, a resin formed by homopolymerization or copolymerization of a carboxyl group-containing monomer, a resin formed by hydrolysis, half-esterification, or half-amidation of an acid anhydride unit of a homopolymer or copolymer of an acid anhydride-containing monomer, and an epoxyacrylate formed by modifying an epoxy resin with an unsaturated monocarboxylic acid or acid anhydride.

Examples of the carboxyl group-containing monomer include acrylic acid, methacrylic acid, itaconic acid, crotonic acid, maleic acid, fumaric acid, and 4-carboxylstyrene.

Examples of the acid anhydride-containing monomer include maleic anhydride.

Similarly, examples include an acidic cellulose derivative containing a carboxylic acid group in a side chain. Other than the above, one formed by adding a cyclic acid anhydride to a hydroxy group-containing polymer is also useful.

The weight-average molecular weight of the alkali-soluble resin is preferably at least 5,000, and more preferably at least 10,000 but no greater than 300,000, and the number-average molecular weight is preferably at least 1,000, and more preferably at least 2,000 but no greater than 250,000. The polydispersity (weight-average molecular weight/number-average molecular weight) is preferably at least 1, and more preferably at least 1.1 but no greater than 10.

The resin that can be used in the present invention may be any of a random polymer, a block polymer, a graft polymer, etc.

The content of Component B-2 in the negative-working photosensitive composition is preferably 1 to 40 mass % relative to the total solids content of the negative-working photosensitive composition, more preferably 3 to 30 mass %, and yet more preferably 4 to 20 mass %.

Component C: Fluorene Compound

The composition for formation of a protective layer preferably comprises a fluorene compound, and more preferably comprises a reactive group-containing fluorene compound. Due to a fluorene compound being used, it is possible to easily introduce a fluorene ring structure into the polymer.

Furthermore, a fluorene ring structure may be introduced into the organic resin by copolymerization of a monomer having a fluorene ring with a polymer such as a binder polymer.

Preferred embodiments of Component C are the same as those of the fluorene compound described above.

With regard to the fluorene compound, one type may be used on its own or two or more types may be used in combination.

The content of the fluorene compound in the composition for formation of a protective layer is preferably 1 to 200 parts by mass relative to 100 parts by mass of the total content of a Component B, more preferably 5 to 150 parts by mass, yet more preferably 10 to 150 parts by mass, and particularly preferably 50 to 120 parts by mass. With this embodiment, a cured material that is obtained has a higher refractive index, a lower dielectric constant, and better transparency.

Component D: Photo-Acid Generator

The composition for formation of a protective layer preferably comprises a photo-acid generator as Component D; in particular when the composition for formation of a protective layer is a positive-working photosensitive composition, it particularly preferably comprises a photo-acid generator.

The 'light' is not particularly limited as long as it is actinic radiation that can apply energy that can generate an initiating species from the photo-acid generator and/or a photopolymerization initiator, which is described later, upon irradiation therewith, and widely includes α-rays, γ-rays, X rays, ultraviolet (UV), visible light, and an electron beam. Among them, light containing at least UV is preferable.

Furthermore, when the composition for formation of a protective layer is a positive-working photosensitive composition, it is preferably a chemically amplified type positive-working photosensitive composition (chemically amplified positive-working photosensitive composition) and may be a non-chemically amplified type positive-working photosensitive composition that employs a 1,2-quinone diazide compound as a photo-acid generator sensitive to actinic radiation. In terms of high sensitivity and excellent transparency, it is preferably a chemically amplified positive-working photosensitive composition.

The photo-acid generator used in the present invention is preferably a compound that is sensitive to actinic radiation having a wavelength of at least 300 nm, and preferably a wavelength of 300 to 450 nm, and that generates an acid, but its chemical structure is not limited. Furthermore, with regard to a photo-acid generator that is not directly sensitive to actinic radiation having a wavelength of at least 300 nm, a compound that becomes sensitive to actinic radiation having a wavelength of at least 300 nm when used in combination with a sensitizer and that generates an acid may be used preferably in combination with a sensitizer. As the photo-acid generator used in the present invention, a photo-acid generator that has a pKa of no greater than 4 and that can generate an acid is preferable, a photo-acid generator that has a pKa of no greater than 3 and that can generate an acid is more preferable, and a photo-acid generator that has a pKa of no greater than 2 and that can generate an acid is most preferable.

Examples of the photo-acid generator include a trichloromethyl-s-triazine, a sulfonium salt, an iodonium salt, a quaternary ammonium salt, a diazomethane compound, an imidosulfonate compound, and an oxime sulfonate compound. Among them, from the viewpoint of insulating properties and sensitivity, it is preferable to use an oxime sulfonate compound. With regard to these photo-acid generators, one type may be used on its own or two or more types may be used in combination. Specific examples of a trichloromethyl-s-triazine, a diaryliodonium salt, a triarylsulfonium salt, a quaternary ammonium salt, and a diazomethane derivative include compounds described in paragraphs 0083 to 0088 of JP-A-2011-221494.

Preferred examples of an oxime sulfonate compound, that is, a compound having an oxime sulfonate structure, include a compound containing an oxime sulfonate structure represented by Formula D1 below.

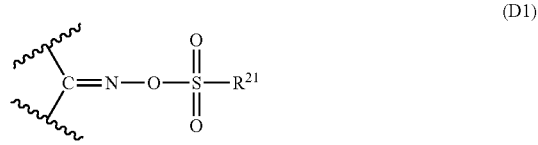

(D1)

In Formula D1, $R^{21}$ denotes an alkyl group or an aryl group, and the wavy line portion denotes the position via which it is bonded to another group.

All groups may be substituted, and the alkyl group denoted by $R^{21}$ may be straight-chain, branched, or cyclic. Allowed substituents are explained below.

The alkyl group of $R^{21}$ is preferably a straight-chain or branched alkyl group having 1 to 10 carbons. The alkyl group of $R^{21}$ may be substituted with an aryl group having 6 to 11 carbons, an alkoxy group having 1 to 10 carbons, or a cycloalkyl group (preferably a bicycloalkyl group, etc. including a bridged alicyclic group such as a 7,7-dimethyl-2-oxonorbornyl group).

The aryl group denoted by $R^{21}$ is preferably an aryl group having 6 to 11 carbons, and more preferably a phenyl group or a naphthyl group. The aryl group of $R^{21}$ may be substituted with an alkyl group having 1 to 10 carbons, an alkoxy group having 1 to 10 carbons, or a halogen atom.

Examples of the oxime sulfonate compound include compounds described in paragraphs 0114 to 0120 of JP-A-2011-221494 and paragraphs 0116 to 0145 of JP-A-2014-132292, but the present invention is not limited thereto.

In the composition for formation of a protective layer, the photo-acid generator is preferably used at 0.1 to 30 parts by mass relative to 100 parts by mass of the resin in the composition for formation of a protective layer, more preferably 0.1 to 10 parts by mass, and particularly preferably 0.5 to 10 parts by mass.

Furthermore, with regard to the photo-acid generator, one type may be used on its own or two or more types may be used in combination.

Component E: Ethylenically Unsaturated Compound

The composition for formation of a protective layer preferably comprises an ethylenically unsaturated compound as Component E; when the composition for formation of a protective layer is a negative-working photosensitive composition in particular, it is more preferable for it to comprise an ethylenically unsaturated compound, and it is yet more preferable for it to comprise a tri- or higher-functional ethylenically unsaturated compound.

The ethylenically unsaturated compound in the present invention is an addition-polymerizable compound having at least one ethylenically unsaturated double bond, and is preferably selected from compounds having at least one, and preferably two, terminal ethylenically unsaturated bonds. Such compounds are widely known in the present technical field, and in the present invention they can be used without particular limitations.

They have a chemical configuration such as for example a monomer, a prepolymer, that is, a dimer, a trimer, or an oligomer, or a mixture thereof, or a copolymer thereof. Examples of the monomer and the copolymer thereof include an unsaturated carboxylic acid (for example, acrylic acid, methacrylic acid, itaconic acid, crotonic acid, isocrotonic acid, maleic acid, etc.), an ester thereof, and an amide thereof, and it is preferable to use an ester of an unsaturated carboxylic acid with an aliphatic polyhydric alcohol compound or an amide of an unsaturated carboxylic acid with an aliphatic polyamine compound. Furthermore, an addition reaction product of an unsaturated carboxylic acid ester or unsaturated carboxylamide having a nucleophilic substituent such as a hydroxy group, an amino group, or a mercapto group with a monofunctional or polyfunctional isocyanate or epoxy, or a dehydration-condensation reaction product with a monofunctional or polyfunctional carboxylic acid is also suitably used. Furthermore, an addition reaction product of an unsaturated carboxylic acid ester or unsaturated carboxylamide having an electrophilic substituent such as an isocyanate group or an epoxy group with a monofunctional or polyfunctional alcohol, amine, or thiol; and a substitution reaction product of an unsaturated carboxylic acid ester or unsaturated carboxylamide having a leaving substituent such as a halogen group or a tosyloxy group with a monofunctional or polyfunctional alcohol, amine, or thiol are also suitable. Moreover, as another example, instead of the above unsaturated carboxylic acid, a group of compounds in which it is replaced by an unsaturated phosphonic acid, a styrene, a vinyl ether, etc. may also be used.

Specific examples of the ester monomer of an aliphatic polyhydric alcohol compound with an unsaturated carboxylic acid include an acrylic acid ester such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tris(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tris(acryloyloxyethyl) isocyanurate, a polyester acrylate oligomer, or an isocyanuric acid ethylene oxide (EO)-modified triacrylate.

Examples of methacrylic acid esters include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis[p-(methacryloxyethoxy)phenyl]d imethylmethane.

Examples of itaconic acid esters include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

Examples of crotonic acid esters include ethylene glycol dicrotonate, tetramethylene glycol dicrotonate, pentaerythritol dicrotonate, and sorbitol tetrad icrotonate.

Examples of isocrotonic acid esters include ethylene glycol diisocrotonate, pentaerythritol diisocrotonate, and sorbitol tetraisocrotonate.

Examples of maleic acid esters include ethylene glycol dimalate, triethylene glycol dimalate, pentaerythritol dimalate, and sorbitol tetramalate.

Examples of other esters that can suitably be used include aliphatic alcohol esters described in JP-B-51-47334 and JP-A-57-196231, those having an aromatic skeleton described in JP-A-59-5240, JP-A-59-5241, and JP-A-2-226149, and those having an amino group described in JP-A-1-165613. Furthermore, the above ester monomers may also be used as mixtures.

Furthermore, specific examples of the amide monomer of an aliphatic polyamine compound with an unsaturated carboxylic acid include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide, and xylylene bismethacrylamide.

Preferred examples of other amide monomers include those having a cyclohexylene structure described in JP-B-54-21726.

Moreover, urethane acrylates described in JP-A-51-37193, JP-B-2-32293, and JP-B-2-16765 and urethane compounds having an ethylene oxide skeleton described in JP-B-58-49860, JP-B-56-17654, JP-B-62-39417, and JP-B-62-39418 are also suitable. Furthermore, due to the use of a polymerizable compound having an amino structure or a sulfide structure in the molecule described in JP-A-63-277653, JP-A-63-260909, and JP-A-1-105238, a photosensitive composition having very good development speed can be obtained Other examples include polyfunctional acrylates and methacrylates such as epoxyacrylates obtained by a reaction between (meth)acrylic acid and an epoxy resin and polyester acrylates described in each of JP-A-48-64183, JP-B-49-43191, and JP-B-52-30490. Furthermore, examples also include specific unsaturated compounds described in JP-B-46-43946, JP-B-1-40337, and JP-B-1-40336 and vinyl phosphonic acid-based compounds described in JP-A-2-25493. In some cases, a structure containing a perfluoroalkyl group described in JP-A-61-22048 is suitably used. Furthermore, photocurable monomers and oligomers described in the Journal of the Adhesion Society of Japan Vol. 20, No. 7, pp. 300 to 308 (1984) may also be used.

With regard to these ethylenically unsaturated compounds, the structure thereof and details of the method in terms of their use alone or in combination, the amount added, etc. may be set freely according to the final performance design of the photosensitive composition. For example, they are selected from the following viewpoints.

In terms of sensitivity, the larger the content of unsaturated groups per molecule in the structure, the more preferable it is, and in many cases a di- or higher-functional structure is preferable. In order to enhance the strength of a cured film, a tri- or higher-functional structure is preferable, and a method in which both sensitivity and strength are adjusted by the combined use of ones having different functionality and/or different polymerizable groups (for example, an acrylic acid ester, a methacrylic acid ester, a styrene compound, or a vinyl ether compound) is also effective.

Furthermore, selection of the ethylenically unsaturated compound and the method of use are important factors for compatibility and dispersibility with respect to other components (for example, a photopolymerization initiator, inorganic particles, etc.) and, for example, compatibility can be improved by the use of a low purity compound or by the combined use of two or more types of other components. Moreover, for the purpose of improving adhesion to a hard surface such as a substrate, a specific structure can be selected.

The content of the ethylenically unsaturated compound is preferably 5 to 90 mass % relative to the total solids content of the composition for formation of a protective layer, more preferably 10 to 85 mass %, and yet more preferably 20 to 80 mass %. When in this range, adhesion and developability are both good without the refractive index being degraded.

Component F: Photopolymerization Initiator

The composition for formation of a protective layer preferably comprises as Component F a photopolymerization initiator, and when the composition for formation of a protective layer is a negative-working photosensitive composition in particular, it particularly preferably comprises a photopolymerization initiator.

The photopolymerization initiator also includes Component D, but the photopolymerization initiator is preferably a radical photopolymerization initiator.

The photopolymerization initiator used in the present invention is preferably a compound that is decomposed by light and initiates and promotes polymerization of a polymerizable compound such as an ethylenically unsaturated compound and that has absorption in a wavelength region of at least 300 nm but no greater than 500 nm. With regard to the photopolymerization initiator, one type may be used on its own or two more types may be used in combination.

Examples of the photopolymerization initiator include an oxime ester compound, an organic halide compound, an oxydiazole compound, a carbonyl compound, a ketal compound, a benzoin compound, an acridine compound, an organic peroxide compound, an azo compound, a coumarin compound, an azide compound, a metallocene compound, a hexaarylbiimidazole compound, an organoboric acid compound, a disulfonic acid compound, an onium salt compound, and an acylphosphine (oxide) compound. Among them, from the viewpoint of sensitivity, an oxime ester compound and a hexaarylbiimidazole compound are preferable, and an oxime ester compound is more preferable.

As the oxime ester compound, compounds described in JP-A-2000-80068, JP-A-2001-233842, published Japanese translation 2004-534797 of a PCT application, JP-A-2007-231000, JP-A-2009-134289, and paragraphs 0046 to 0059 of International Laid-open Patent No. 2012/057165 may be used.

Specific examples of the organic halide compound include compounds described in Wakabayashi et al., 'Bull Chem. Soc. Japan', 42, 2924 (1969), U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243, JP-A-63-298339, M. P. Hutt, et al., Journal of Heterocyclic Chemistry, Vol. 7, Issue 3, 511-518 (1970), etc.; an oxazole compound substituted with a trihalomethyl group and an s-triazine compound may in particular be cited.

Examples of the hexaaryl biimidazole compound include various compounds described in JP-B-6-29285, U.S. Pat. Nos. 3,479,185, 4,311,783, 4,622,286, etc.

Examples of the acylphosphine (oxide) compound include a monoacylphosphine oxide compound and a bisacylphosphine oxide compound, and specific examples include Irgacure 819, Darocur 4265, and Darocur TPO from BASF.

With regard to the photopolymerization initiator, one type may be used or two or more types may be used in combination.

The content of the photopolymerization initiator in the composition for formation of a protective layer is preferably 0.5 to 30 parts by mass relative to 100 parts by mass of the total solids content of the composition, more preferably 1 to 20 parts by mass, yet more preferably 1 to 10 parts by mass, and particularly preferably 1.5 to 5 parts by mass.

Component G: Solvent

The composition for formation of a protective layer may comprise as Component G a solvent. The composition for formation of a protective layer is preferably prepared as a liquid in which the above components and an optional component, which is further described later, are dissolved and/or dispersed in a solvent.

As the solvent used in the composition for formation of a protective layer, a known solvent may be used, and examples include an ethylene glycol monoalkyl ether, an ethylene glycol dialkyl ether, an ethylene glycol monoalkyl ether acetate, a propylene glycol monoalkyl ether, a propylene glycol dialkyl ether, a propylene glycol monoalkyl ether acetate, a diethylene glycol dialkyl ether, a diethylene glycol monoalkyl ether acetate, a dipropylene glycol monoalkyl ether, a dipropylene glycol dialkyl ether, a dipropylene glycol monoalkyl ether acetate, an ester, a ketone, an amide, and a lactone. Solvents described in paragraphs 0174 to 0178 of JP-A-2011-221494 may also be cited as examples.

In addition to these solvents, as necessary, a solvent such as benzyl ethyl ether, dihexyl ether, ethylene glycol monophenyl ether acetate, diethylene glycol monomethyl ether, diethylene glycol monoethyl ether, isophorone, caproic acid, caprylic acid, 1-octanol, 1-nonanol, benzyl alcohol, anisole, benzyl acetate, ethyl benzoate, diethyl oxalate, diethyl maleate, ethylene carbonate, or propylene carbonate may be added.

With regard to these solvents, one type may be used on its own or two or more types may be used in combination. With regard to solvents that can be used in the present invention, it is preferable to use one type on its own or two types in combination.

It is also preferable for Component G to be a solvent having a boiling point of at least 130° C. but less than 160° C., a solvent having a boiling point of at least 160° C., or a mixture thereof.

Examples of solvents having a boiling point of at least 130° C. but less than 160° C. include propylene glycol monomethyl ether acetate (boiling point 146° C.), propylene glycol monoethyl ether acetate (boiling point 158° C.), propylene glycol methyl n-butyl ether (boiling point 155° C.), and propylene glycol methyl n-propyl ether (boiling point 131° C.).

Examples of solvents having a boiling point of at least 160° C. include ethyl 3-ethoxypropionate (boiling point 170° C.), diethylene glycol methyl ethyl ether (boiling point 176° C.), propylene glycol monomethyl ether propionate (boiling point 160° C.), dipropylene glycol methyl ether acetate (boiling point 213° C.), 3-methoxybutyl ether acetate (boiling point 171° C.), diethylene glycol diethyel ether (boiling point 189° C.), diethylene glycol dimethyl ether (boiling point 162° C.), propylene glycol diacetate (boiling point 190° C.), diethylene glycol monoethyl ether acetate (boiling point 220° C.), dipropylene glycol dimethyl ether (boiling point 175° C.), and 1,3-butylene glycol diacetate (boiling point 232° C.).

Among them, the solvent is preferably a propylene glycol monoalkyl ether acetate, and particularly preferably propylene glycol monomethyl ether acetate.

The content of the solvent in the composition for formation of a protective layer is preferably at least 20 mass % but no greater than 95 mass %, more preferably at least 50 mass % but no greater than 95 mass %, and yet more preferably at least 65 mass % but no greater than 95 mass %. When the content of the solvent is in this range, the coating properties and the flatness during coating are good.

Component H: Alkoxysilane Compound

The composition for formation of a protective layer preferably comprises as Component H an alkoxysilane compound. When an alkoxysilane compound is used, adhesion between a film formed from the composition for formation of a protective layer and a support, etc. can be improved.

The alkoxysilane compound is not particularly limited as long as it is a compound having at least one alkoxy group directly bonded to a silicon atom, but is preferably a dialkoxysilyl group- and/or trialkoxysilyl group-containing compound, and more preferably a trialkoxysilyl group-containing compound.

The alkoxysilane compound that can be used in the present invention is preferably a compound that improves adhesion between a cured film and a substrate such as a silicon compound such as silicon, silicon oxide, or silicon nitride, or a metal such as gold, copper, molybdenum, titanium, or aluminum. Specifically, a known silane coupling agent, etc. is also effective. A silane coupling agent having an ethylenically unsaturated bond is preferable.

Examples of the silane coupling agent include γ-aminopropyltrimethoxysilane, γ-aminopropyltriethoxysilane, a γ-glycidoxypropyltrialkoxysilane, a γ-glycidoxypropyldialkoxysilane, a γ-methacryloxypropyltrialkoxysilane, a γ-methacryloxypropyldialkoxysilane, a γ-chloropropyltrialkoxysilane, a γ-mercaptopropyltrialkoxysilane, a β-(3,4-epoxycyclohexyl)ethyltrialkoxysilane, and a vinyltrialkoxysilane. Among them, a γ-methacryloxypropyltrialkoxysilane, a racryloxypropyltrialkoxysilane, a vinyltrialkoxysilane, and a γ-glycidoxypropyltriacoxysilane are more preferable. With regard to these, one type may be used on its own or two or more types may be used in combination.

Examples of commercial products include KBM-403 and KBM-5103 manufactured by Shin-Etsu Chemical Co., Ltd.

The content of the alkoxysilane compound in the composition for formation of a protective layer is preferably 0.1 to 30 mass % relative to the total solids content of the composition, more preferably 2 to 20 mass %, and yet more preferably 3 to 10 mass %. With regard to the alkoxysilane compound, one type may be used on its own or two or more types may be used in combination. When two or more types are used, the total amount is preferably in the above range.

Component I: Basic Compound

The composition for formation of a protective layer, in particular the positive-working photosensitive composition, preferably comprises a basic compound from the viewpoint of liquid storage stability.

Any basic compound may be selected from those used in a chemically amplified resist and used. Examples include an aliphatic amine, an aromatic amine, a heterocyclic amine, a quaternary ammonium hydroxide, and a quaternary ammonium salt of a carboxylic acid.

Examples of the basic compound include compounds described in paragraph 0169 of JP-A-2014-10200.

With regard to the basic compound that can be used in the present invention, one type thereof may be used on its own or two or more types may be used in combination, but it is preferable to use two or more types in combination, it is more preferable to use two types in combination, and it is yet more preferable to use two types of heterocyclic amines in combination.

The content of the basic compound in the composition for formation of a protective layer is preferably 0.001 to 1 mass % relative to the total organic solids content of the composition, and more preferably 0.002 to 0.5 mass %.

Component J: Surfactant

The composition for formation of a protective layer of the present invention may comprise a surfactant.

As the surfactant, any of anionic, cationic, nonionic, or amphoteric surfactants may be used, but a nonionic surfactant is preferable. The surfactant is preferably a nonionic surfactant, and more preferably a fluorine-based surfactant.

Preferred examples of the surfactant also include compounds described in paragraphs 0119 to 0123 of JP-A-2014-238438.

When added, the content of the surfactant in the composition for formation of a protective layer is preferably 0.001 to 5.0 mass % relative to the total solids content of the composition, and more preferably 0.01 to 2.0 mass %.

With regard to the surfactant, only one type may be contained or two or more types may be contained. When two or more types are contained, the total amount is preferably in the above range.

Component K: Thermal Crosslinking Agent

The composition for formation of a protective layer preferably comprises a thermal crosslinking agent as necessary. Due to a thermal crosslinking agent being added, a cured film obtained using the composition for formation of a protective layer can be made stronger.

The thermal crosslinking agent is not limited as long as it can cause a crosslinking reaction upon heating (however, Component A to Component C and Component E are excluded). Examples include a compound containing at least two epoxy groups or oxetanyl groups per molecule described in paragraphs 0188 to 0191 of JP-A-2011-221494, an alkoxymethyl group-containing crosslinking agent described in paragraphs 0192 to 0194 of JP-A-2011-221494, a compound having at least one ethylenically unsaturated double bond, or a blocked isocyanate compound described in paragraphs 0147 to 0149 of JP-A-2012-208200.

The amount of thermal crosslinking agent added in the composition for formation of a protective layer is preferably 0.01 to 50 parts by mass relative to 100 parts by mass of the total solids content of the composition, more preferably 0.1 to 30 parts by mass, and yet more preferably 0.5 to 20 parts by mass. Due to it being added in this range, a cured film having excellent mechanical strength and solvent resistance is obtained. With regard to the thermal crosslinking agent, a plurality thereof may be used in combination, and in this case the content is calculated by adding the contents of all the thermal crosslinking agents.

Component L: Heterocyclic Compound Having Two or More Nitrogen Atoms

When a3 is used as Component A, the composition for formation of a protective layer preferably comprises as Component L a heterocyclic compound having two or more nitrogen atoms from the viewpoint of reduction in haze.

Component L is not particularly limited as long as it has two or more nitrogen atoms, but it is preferable for it to be a heterocyclic compound having two or more nitrogen atoms as members of a heterocyclic ring, more preferably a compound having a heterocyclic structure having nitrogen atoms at 1- and 3-positions, and yet more preferably a compound having a 5-membered or 6-membered heterocyclic structure having nitrogen atoms at 1- and 3-positions.

Examples of the basic compound include compounds described in paragraph 0168 to 0182 of JP-A-2014-238438, and preferred embodiments described in paragraph 0168 to 0182 of JP-A-2014-238438 can be referred.

With regard to Component L, one type thereof may be used on its own or two or more types may be used in combination.

The content of Component L in the composition for formation of a protective layer is preferably 0.1 to 20 mass % relative to the total solids content of the composition, more preferably 0.5 to 15 mass %, and yet more preferably 0.5 to 10 mass %. When in this range, a cured material having better dispersibility for inorganic particles and lower haze can be obtained.

—Antioxidant—

The composition for formation of a protective layer preferably comprises an antioxidant.

As the antioxidant, a known antioxidant may be contained. Due to an antioxidant being added, there are the advantages that coloration of a cured film can be prevented, reduction in film thickness due to decomposition can be suppressed, and the heat-resistant transparency is excellent.

Examples of such an antioxidant include a phosphorus-based antioxidant, an amide, a hydrazide, a hindered amine-based antioxidant, a sulfur-based antioxidant, a phenol-based antioxidant, an ascorbic acid, zinc sulfate, a saccharide, a nitrite, a sulfite salt, a thiosulfate, and a hydroxylamine derivative. Among them, from the viewpoint of coloration of a cured film and reduction in film thickness, a phenolic antioxidant, an amide-based antioxidant, a hydrazide-based antioxidant, and a sulfur-based antioxidant are particularly preferable. With regard to these, one type may be used on its own or two or more types may be mixed.

Examples of the antioxidant include compounds described in paragraph 0066 to 0093 of Japanese registered patent No. 5306903 and compounds described in paragraph 0178 of JP-A-2014-10200.

The content of the antioxidant is preferably 0.1 to 10 mass % relative to the total solids content of the composition, more preferably 0.2 to 5 mass %, and particularly preferably 0.5 to 4 mass %. With this range, a film that is formed has sufficient transparency and good sensitivity when forming a pattern.

Furthermore, as an additive other than an antioxidant, various types of UV absorber or metal deactivating agent, etc. described in "Kobunshi Tenkazai no Shintenkai (New Developments in Polymer Additives)" (The Nikkan Kogyo Shimbun, Ltd.) may be added to the composition for formation of a protective layer.

—Dispersant—

The composition for formation of a protective layer preferably comprises a dispersant. Due to it comprising a dispersant, the dispersibility of Component A, in particular a3, in the composition can be improved.

A known dispersant may be used as the dispersant; for example, a known pigment dispersing agent may be appropriately selected and used.

As the dispersant, for example, a known pigment dispersing agent may be appropriately selected and used.

Furthermore, as the dispersant, a polymeric dispersant may preferably be used. The polymeric dispersant referred to here is a dispersant having a molecular weight (weight-average molecular weight) of at least 1,000.

Examples of the antioxidant include compounds described in paragraph 0199 to 0213 of International Patent Laid-open No. 2014/003111 and compounds described in paragraph 0154 to 0233 of International Patent Laid-open No. 2014/199967.

With regard to the dispersant, one type thereof may be used on its own or two or more types may be used in combination.

The content of the dispersant in the composition for formation of a protective layer is preferably in the range of 5 to 70 mass % relative to the total solids content of the composition, and more preferably in the range of 10 to 50 mass %.

—Polymerization Inhibitor—

The composition for formation of a protective layer may comprise a polymerization inhibitor. Due to it comprising a polymerization inhibitor, a polymerization reaction due to the leakage of light is suppressed, and the developability is excellent.

The polymerization inhibitor referred to here is a substance that carries out hydrogen supply (or the imparting of hydrogen), energy supply (or the imparting of energy), electron supply (or the imparting of an electron), etc. to a polymerization-initiating radical component generated from a polymerization initiator upon exposure or heat to thus deactivate a polymerization-initiating radical and inhibit initiation of polymerization. For example, compounds described in paragraphs 0154 to 0173 of JP-A-2007-334322, etc. may be used.

The content of the polymerization inhibitor in the composition for formation of a protective layer is not particularly limited but is preferably 0.005 to 0.5 mass % relative to the total solids content of the composition, and more preferably 0.01 to 0.5 mass %. Adjusting the amount of polymerization inhibitor added enables the patterning properties to be improved without impairing the sensitivity.

—Other Components—

In addition to the above components, the composition for formation of a protective layer may comprise as necessary another component such as a sensitizer, an adhesion-improving agent, an acid-increasing agent, a development accelerator, a plasticizer, a thickener, or an organic or inorganic precipitation inhibitor. As these components, those described in for example JP-A-2014-235216, JP-A-2009-98616, JP-A-2009-244801, and JP-A-2011-221494 and other known components may be used.

Furthermore, as another additive, a thermal radical generator described in paragraphs 0120 to 0121 of JP-A-2012-8223 and a nitrogen-containing compound and a thermal acid generator described in International Patent Laid-open No. 2011/136074 may be used.

A method for forming the protective layer using the composition for formation of a protective layer is not particularly limited, and can be use a known method, and is preferably a method of coating, and exposure, developing and/or heat treatment as necessary.

A method for applying the composition for formation of a protective layer is not particularly limited, and examples include a slit coating method, a spray method, a roll coating method, a spin coating method, a cast coating method, a slit-and-spin method, an inkjet method, and a printing method (flexographic, gravure, screen, etc.). An inkjet method and a printing method are preferable since a composition can be placed only in a necessary location, thus preventing the composition being wasted.

Among them, the composition for formation of a protective layer is used suitably in a printing method and an inkjet method, and particularly suitably in a screen printing method and an inkjet method.

Furthermore, before coating a support with the composition for formation of a protective layer, a so-called pre-wetting method as described in JP-A-2009-145395 may be applied.

When the composition for formation of a protective layer comprises a solvent, it is preferable to carry out drying. As a drying method, a method in which solvent is removed from a coated composition film by means of pressure reduction (vacuum) and/or heating, etc. to thus form a dry coating on a substrate can be cited as a preferred example. Heating conditions when drying are preferably on the order of 70° C. to 130° C. and 30 to 300 seconds.

Coating and drying may be carried out in that order, at the same time, or repeatedly in turn. For example, drying may be carried out after inkjet coating is completely finished, or a support may be heated and drying may be carried out while discharging a composition by means of an inkjet coating method.

Exposure involves generating an acid and/or a polymerization initiating species from a photo-acid generator and/or a photopolymerization initiator using actinic radiation and decomposing an acid-decomposable group by the acid and/or polymerizing an ethylenically unsaturated compound, etc.

As an exposure light source, a low-pressure mercury lamp, a high pressure mercury lamp, an ultra high-pressure mercury lamp, a chemical lamp, an LED light source, an excimer laser generator, etc. may be used, and actinic radiation having a wavelength of at least 300 nm but no greater than 450 nm such as i-line (365 nm), h-line (405 nm), or g-line (436 nm) may preferably be used. The irradiating light may be adjusted as necessary by way of a spectral filter such as a long wavelength cut filter, a short wavelength cut filter, or a band-pass filter.

As exposure equipment, various types of exposure equipment such as a mirror projection aligner, a stepper, a scanner, proximity, contact, a microlens array, a lens scanner, and laser exposure may be used.

The amount of exposure in the exposure step is not particularly limited, but is preferably 1 to 3,000 mJ/cm$^2$, and more preferably 1 to 500 mJ/cm$^2$.

Exposure may be carried out in a state in which there is an oxygen barrier. Examples of oxygen barrier means include exposing under an atmosphere of nitrogen and providing an oxygen barrier film.

Exposure may be carried out for at least part of the composition, and for example it may be whole face exposure or pattern exposure.

It is also possible to carry out, after exposure, a post-exposure heating treatment: Post Exposure Bake (hereinafter, also called 'PEB'). The temperature when PEB is carried out is preferably at least 30° C. but no greater than 130° C., more preferably at least 40° C. but no greater than 120° C., and particularly preferably at least 50° C. but no greater than 110° C.

The heating method is not particularly limited, and a known method may be used. Examples include a hotplate, an oven, and an infrared heater.

The heating time is preferably on the order of 1 minute to 30 minutes in the case of a hotplate, and preferably on the order of 20 minutes to 120 minutes in other cases. With this range, it is possible to carry out heating without damaging the substrate or the equipment.

The formation of the protective layer may further comprise, as necessary, a development step of developing the exposed layer using a developer.

In the development step, a curable composition that has been patternwise exposed is developed using a solvent or an alkaline developer to thus form a pattern. The developer used in the development step preferably comprises a basic compound. As the basic compound, an aqueous solution of an alkali metal hydroxide such as lithium hydroxide, sodium hydroxide, or potassium hydroxide; an alkali metal carbonate such as sodium carbonate or potassium carbonate; an alkali metal bicarbonate such as sodium bicarbonate or potassium bicarbonate; an ammonium hydroxide such as tetramethylammonium hydroxide, tetraethylammonium hydroxide, tetrapropylammonium hydroxide, tetrabutylammonium hydroxide, benzyltrimethylammonium hydroxide, or choline hydroxide; or sodium silicate, sodium metasilicate, etc. may be used. It is also possible to use as the developer an aqueous solution obtained by adding an appropriate amount of a surfactant or a water-soluble organic solvent such as methanol or ethanol to the above aqueous solution of an alkali.

Preferred examples of the developer include a 0.4 to 2.5 mass % aqueous solution of tetramethylammonium hydroxide.

The pH of the developer is preferably 10.0 to 14.0. The development time is preferably 30 to 500 sec., and the method for development may be any of a liquid-puddle method (puddle method), a shower method, a dip method, etc.

A rinsing step may be carried out after development. In the rinsing step, removal of attached developer and removal of development residue are carried out by washing the substrate with pure water, etc. after development.

As a rinsing method, a known method may be used. Examples include shower rinsing and dip rinsing.

With regard to pattern exposure and development, a known method and a known developer may be used. For example, a pattern exposure method and a development method described in JP-A-2011-186398 and JP-A-2013-83937 may suitably be used.

After the exposure described above, an exposed layer may be carried out a heat treatment. Carrying out a heat treatment after exposure enables a cured film having excellent strength to be obtained.

The temperature of the heat treatment is preferably 80° C. to 300° C., more preferably 100° C. to 280° C., and particularly preferably 120° C. to 250° C. With this embodiment, it is surmised that, when a1 and/or a2 is used as Component A, condensation of Component A progresses to an appropriate degree, and the physical properties of a cured film are improved.

Furthermore, the time for the heat treatment is not particularly limited, but it is preferably 1 minute to 360 minutes, more preferably 5 minutes to 240 minutes, and yet more preferably 10 minutes to 120 minutes.

Curing by means of light and/or heat in the process for producing a cured film of the present invention may be carried out continuously or in succession.

When a heat treatment is carried out, the transparency may be improved by carrying it out under an atmosphere of nitrogen.

A heat treatment step may also be carried out after carrying out baking at a relatively low temperature prior to the heat treatment step (post-bake) (addition of a middle-bake step). When a middle-bake is carried out, it is preferable to carry out heating at 90° C. to 150° C. for 1 to 60 minutes, and after that a post-bake is carried out at 120° C. to 300° C.

It is also possible to carry out middle-bake and post-bake heating in multiple stages of three or more stages. Designing the middle-bake and post-bake in this way enables the taper angle of a pattern to be adjusted. The above heating may be carried out by using a known heating method such as a hotplate, an oven, or an infrared heater.

Prior to the post-bake, the whole face of a substrate on which a pattern has been formed is re-exposed to actinic radiation (post-exposure), and then is subjected to a post-bake; it is surmised that initiating species are thereby generated by a condensation reaction of each component itself and/or thermal decomposition of photopolymerization initiator remaining in an exposed area and are made to function as a catalyst for promoting a crosslinking step, thus promoting film curing. The amount of exposure when the post-exposure step is included is preferably 100 to 3,000 mJ/cm$^2$, and particularly preferably 100 to 500 mJ/cm$^2$.

(Transfer Material)

The touch panel member of the present invention may be formed by film transfer of the protective layer and is preferably one prepared using the transfer material of the present invention shown below.

The transfer material of the present invention is characterized in that it comprises at least a layer having a thickness of 0.04 to 10 μm above a temporary support, at least part of the layer having a refractive index that increases continuously from the temporary support side toward the side opposite to the temporary support, and the protective layer satisfying Expression 2' below.

$$0.2 \leq n(\text{opposite side}) - n(\text{temporary support side}) \quad (2)$$

In the expression, the refractive index of the interface, on the temporary support side, of the layer is defined as n(temporary support side), and the refractive index of the interface, on the side opposite to the temporary support, of the layer is defined as n(opposite side).

For example, the touch panel member of the present invention is preferably formed by removing the temporary support from the transfer material of the present invention after transferring onto a substrate as the protective layer the layer whose refractive index increases continuously.

A preferred embodiment of the layer whose refractive index increases continuously in the transfer material is the same as a preferred embodiment for the protective layer.

Furthermore, a preferred embodiment of Expression 2' is the same as a preferred embodiment of Expression 2 in which n(protect-electrode) and n(protect-surface) are replaced by n(opposite side) and n(temporary support side) respectively.

—Temporary Support—

The transfer material comprises a temporary support.

The temporary support preferably has flexibility. It is preferable that when applying pressure or when heating and applying pressure, deformation, shrinkage, or stretching do not occur to a great extent. Examples of such a temporary support include a polyethylene terephthalate film, a cellulose triacetate film, a polystyrene film, and a polycarbonate film, and among them a biaxially stretched polyethylene terephthalate film is particularly preferable.

The thickness of the temporary support is not particularly limited but is preferably 5 to 300 μm, and more preferably 20 to 200 μm.

The temporary support may be transparent or may contain dyed silicon, an alumina sol, a chromium salt, a zirconium salt, etc.

A conductive layer or a hydrophobic polymer layer may be imparted to the temporary support by a method described in paragraphs 0079 to 0095JP-A-2005-221726, etc.

—Thermoplastic Resin Layer—

The transfer material may have at least one thermoplastic resin layer. The thermoplastic resin layer is preferably provided between the temporary support and the layer whose refractive index increases continuously. That is, the transfer material preferably comprises, in order, the temporary support, the thermoplastic resin layer, and the layer whose refractive index increases continuously.

A component used in the thermoplastic resin layer is particularly preferably selected from organic polymers having a softening point of about 80° C. or below by the Vicat method (specifically, a polymer softening point measurement method in accordance with ASTMD1235 of the American Society for Testing and Materials).

Specific examples include organic polymers such as a polyolefin such as polyethylene or polypropylene, an ethylene copolymer between ethylene and vinyl acetate or a saponified product thereof, ethylene and an acrylic acid ester or a saponified product thereof, polyvinyl chloride, a vinyl chloride copolymer between vinyl chloride and vinyl acetate or a saponified product thereof, polyvinylidene chloride, a vinylidene chloride copolymer, polystyrene, a styrene copolymer between styrene and a (meth)acrylic acid ester or a saponified product thereof, polyvinyltoluene, a vinyltoluene copolymer between vinyltoluene and a (meth)acrylic acid ester or a saponified product thereof, a poly(meth)acrylic acid ester, a (meth)acrylic acid ester copolymer between butyl (meth)acrylate and vinyl acetate, etc., and a polyamide resin such as a vinyl acetate copolymer nylon, a copolymer nylon, an N-alkoxymethylated nylon or an N-dimethylaminated nylon.

The thickness of the thermoplastic resin layer is preferably 6 to 100 µm, and more preferably 6 to 50 µm. When the thickness of the thermoplastic resin layer is in the range of 6 to 100 µm, even if there are asperities on the substrate, the influence of the asperities can be absorbed.

—Intermediate Layer—

The transfer material may comprise an intermediate layer for the purpose of preventing components from being mixed when applying a plurality of coating layers or when storing a transfer material after coating. The intermediate layer is preferably provided between the temporary support and the layer whose refractive index increases continuously (between the thermoplastic resin layer and the layer whose refractive index increases continuously when there is the thermoplastic resin layer). That is, the transfer material preferably comprises, in order, the temporary support, the thermoplastic resin layer, the intermediate layer, and the layer whose refractive index increases continuously.

The intermediate layer is preferably an oxygen-blocking film, which has an oxygen-blocking function, and is described as a 'separation layer' in JP-A-5-72724; in this case, the sensitivity at the time of exposure increases, the time load on exposure equipment decreases, and the productivity improves.

The oxygen-blocking film is preferably one that shows low oxygen permeability and that is dispersed or dissolved in water or an alkali aqueous solution, and may be selected as appropriate from known films. Among them, a combination of polyvinyl alcohol and polyvinylpyrrolidone is particularly preferable.

The thickness of the intermediate layer is preferably 0.1 to 5.0 µm, and more preferably 0.5 to 2.0 µm. When in the range of 0.1 to 5.0 µm, the oxygen-blocking ability does not decrease, and the time taken for development or removal of the intermediate layer is not too long.

—Protective Peel-Off Layer—

It is preferable to provide the transfer material with a protective peel-off layer (also called a cover film) so as to cover the layer whose refractive index increases continuously in order to protect for pollution and damage in conserving the transfer material. The protective peel-off layer may be formed from the same material as or a similar material to that of the temporary support, but should be easily separated from an uncured layer. As a material for the protective peel-off layer, for example, a silicone paper or a polyolefin or polytetrafluoroethylene sheet is appropriate.

The maximum value of the haze of the protective peel-off layer is preferably no greater than 3.0%, and from the viewpoint of suppressing more effectively the occurrence of post-development defects in the layer whose refractive index increases continuously, it is preferably no greater than 2.5%, more preferably no greater than 2.0%, and particularly preferably no greater than 1.0%.

The thickness of the protective peel-off layer is preferably 1 to 100 µm, more preferably 5 to 50 µm, and particularly preferably 10 to 30 µm. When this thickness is at least 1 µm, the strength of the protective peel-off layer is sufficient and the layer is resistant to tearing, and when it is no greater than 100 µm, the cost of the protective peel-off layer is not high, and the protective peel-off layer is resistant to creasing when laminating.

With regard to the protective peel-off layer, examples of commercially available ones include, but are not limited to, Alphan MA-410, E-200C, and E-501 manufactured by Oji Paper Co., Ltd., a polypropylene film manufactured by Shin-Etsu Film Co., Ltd., and a polyethylene terephthalate film of the PS series such as PS-25 manufactured by Teijin Limited. It is also possible to simply produce one by subjecting a commercially available film to sandblasting.

As the protective peel-off layer, a polyolefin film such as a polyethylene film may be used. A polyolefin film that is used as a protective peel-off layer may suitably be produced by thermally melting starting materials and kneading, extruding, biaxially stretching, casting, or inflating.

—Process for Producing Transfer Material—

A method for producing the transfer material is not particularly limited, and a known method may be used. Furthermore, a method for forming the layer whose refractive index increases continuously in the transfer material may suitably employ the method described above.

As a method for coating a temporary support with a coating solution for formation of the above thermoplastic resin layer and a coating solution for formation of the above intermediate layer, a known coating method may be used. For example, they may be formed by applying the coating solutions using a coating machine such as a spinner, a whirler, a roller coater, a curtain coater, a knife coater, a wire bar coater, or an extruder, followed by drying.

—Solvent—

The coating solution for formation of a thermoplastic resin layer and the coating solution for formation of an intermediate layer may be prepared suitably by the use of a solvent together with each of the components.

Examples of the solvent include an ester such as for example ethyl acetate, n-butyl acetate, isobutyl acetate, amyl formate, isoamyl acetate, isobutyl acetate, butyl propionate, isopropyl butyrate, ethyl butyrate, butyl butyrate, an alkyl ester, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, or ethyl ethoxyacetate, a 3-oxypropionic acid alkyl ester such as a methyl 3-oxypropionate or an ethyl 3-oxypropionate (for example, methyl 3-methoxypropionate, ethyl 3-methoxypropionate, methyl 3-ethoxypropionate, or ethyl 3-ethoxypropionate), a 2-oxypropionic acid alkyl ester such as a methyl 2-oxypropionate, an ethyl 2-oxypropionate, or a propyl 2-oxypropionate (for example, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, or ethyl 2-ethoxy-2-methylpropionate), methyl pyruvate, ethyl pyruvate, propyl pyruvate, methyl acetoacetate, ethyl acetoacetate, methyl 2-oxobutanoate, or ethyl 2-oxobutanoate; an ether such as for example diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether acetate, propylene glycol monoethyl ether acetate, or propylene glycol propyl ether acetate; a ketone such as for example methyl ethyl ketone, methyl isobutyl ketone, cyclohexanone, 2-heptanone, or 3-heptanone; and an aromatic hydrocarbon such as for example toluene or xylene.

Among them, methyl ethyl ketone, methyl isobutyl ketone, xylene, cyclohexanone, propylene glycol monomethyl ether, propylene glycol monomethyl ether acetate, etc. are desirable.

The solvent may be used on its own or two or more types may be used in combination.

A method for covering the layer whose refractive index increases continuously with the protective peel-off layer is not particularly limited, and a method in which the protective peel-off layer is superimposed and compression-bonded to the layer whose refractive index increases continuously above a temporary support may be used.

The compression bonding may employ a known laminator such as a laminator, a vacuum laminator, or an auto cut laminator, which can further enhance productivity.

The conditions for compression bonding are preferably an atmospheric temperature of 20° C. to 45° C. and a line pressure of 1,000 to 10,000 N/m.

—Lamination Method—

Transfer (lamination) of the layer whose refractive index increases continuously onto a substrate surface is carried out by superimposing the layer whose refractive index increases continuously onto a substrate surface and applying pressure and heat. Lamination may employ a known laminator such as a laminator, a vacuum laminator, or an auto cut laminator, which can further enhance productivity.

The lamination method may be either a continuous type or a single sheet type, but a single sheet type is preferable in terms of bubbles not entering between a transfer material and a substrate when transferring a stamped-out transfer material onto the substrate. Specifically, a method employing a vacuum laminator is preferable.

Examples of equipment used for lamination (continuous type/single sheet type) include a V-SE340aaH manufactured by Climb Products.

Examples of the vacuum laminator include one manufactured by Takano Seiki Co., Ltd., and the FVJ-540R and FV700 manufactured by Taisei Laminator Co., Ltd.

It is preferable for there to be included, prior to affixing the transfer material to the substrate, a step of layering a support on the side of the temporary support opposite to the layer whose refractive index increases continuously, since it makes it harder for bubbles to enter during lamination. Examples of the support used here include, without being particularly limited to, those below.

The film thickness of the support is preferably in the range of 50 to 200 μm.

—Step of Removing Temporary Support—

A process for producing the transfer material preferably comprises a step of removing the temporary support from the transfer material affixed to the substrate.

—Step of Removing Thermoplastic Resin Layer and Step of Removing Intermediate Layer—

Furthermore, when the transfer material comprises a thermoplastic resin layer or an intermediate layer, it is preferable for there to be included a step of removing the thermoplastic resin layer and/or the intermediate layer.

The step of removing the thermoplastic resin layer and/or the intermediate layer may be carried out using an alkali developer that is usually used for a photolithographic method. The alkali developer is not particularly limited, and the developer described above or a known developer such as one described in JP-A-5-72724 may be used. With regard to the developer, one in which a layer to be developed shows dissolution development behavior is preferable, and one comprising a compound having for example a pKa of 7 to 13 at 0.05 to 5 mol/L is preferable. Furthermore, a small amount of organic solvent that is miscible with water may be added. Examples of the organic solvent having miscibility with water include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, ε-caprolactone, γ-butyrolactone, dimethylformamide, dimethylacetamide, hexamethylphosphoramide, ethyl lactate, methyl lactate, ε-caprolactam, and N-methylpyrrolidone. The concentration of the organic solvent is preferably 0.1 mass % to 30 mass %.

The alkali developer may further comprise a known surfactant. The concentration of the surfactant is preferably 0.01 mass % to 10 mass %.

As a method for the step of removing a thermoplastic resin layer and/or an intermediate layer, any of a puddle method, a shower method, a shower & spin method, a dip method, etc. may be used. The shower method is explained here; a thermoplastic resin layer or an intermediate layer may be removed by spraying a developer thereonto using a shower. Furthermore, after development it is preferable to remove residue by spraying a washing agent, etc. using a shower and rubbing with a brush. The liquid temperature is preferably 20° C. to 40° C. and the pH is preferably 8 to 13.

—Post-Baking Step—

It is preferable for there to be included a post-baking step after the transfer step. It is more preferable for there to be included a step of carrying out post-baking after the step of removing a thermoplastic resin layer and an intermediate layer.

From the viewpoint of productivity, the post-baking step is preferably carried out by heating at 50° C. to 300° C. under an environment of 0.08 to 1.2 atm. Here, 1 atm=101, 325 Pa (atmospheric pressure).

Heating of the post-baking is more preferably carried out under an environment of 0.5 atm or greater. The upper limit is more preferably under an environment of 1.1 atm or below, and particularly preferably under an environment of 1.0 atm or below. Furthermore, from the viewpoint of reduction of production costs without using special pressure-reducing equipment, it is particularly preferable to carry it out under an environment of 1 atm (atmospheric pressure).

The temperature of the post-baking is preferably 50° C. to 300° C., more preferably 100° C. to 300° C., and yet more preferably 120° C. to 300° C.

It is also possible to carry out the post-baking at two or more different temperatures for respective predetermined times. For example, heating is first carried out at 50° C. to 200° C., and preferably 100° C. to 200° C., and subsequently heating is carried out at 200° C. to 280° C., and preferably 220° C. to 260° C.

The time of the post-baking is more preferably 20 to 150 minutes, and particularly preferably 30 to 100 minutes. When it is carried out in two or more temperature stages, it is preferably carried out for a total of 20 to 150 minutes of the respective temperature stages.

The post-baking may be carried out under an environment of air or under a nitrogen-purged environment, but it is particularly preferable to carry it out under an environment of air in terms of the production costs being reduced without using special pressure-reducing equipment.

—Other Step—

The process for producing the transfer material may comprise another step, such as a post-exposure step.

As an example of the post-exposure step, the development step, the step of removing a thermoplastic resin layer and/or an intermediate layer, and another step, a method described in paragraphs 0035 to 0051 of JP-A-2006-23696 may also be suitably used in the present invention.

(Touch Panel and Touch Panel Display Device)

The touch panel of the present invention comprises the touch panel member of the present invention.

The touch panel display device of the present invention comprises the touch panel member of the present invention.

As a detection method, various known types of methods such as a capacitance method, a resistive film method, or an optical method may be employed. Among them, a capacitance method is preferable.

As a touch panel type, the so-called in-cell type (for example, those shown in FIG. 5, FIG. 6, FIG. 7, and FIG. 8 of published Japanese translation 2012-517051 of a PCT application), the so-called on-cell type (for example, one shown in FIG. 19 of JP-A-2013-168125, those shown in FIG. 1 and FIG. 5 of JP-A-2012-89102), an OGS (One Glass Solution) type, a TOL (Touch-on-Lens) type (for example, one shown in FIG. 2 of JP-A-2013-54727), another constitution (for example, one shown in FIG. 6 of JP-A-2013-164871), and various kinds of out-cell type (so-called GG, G1.G2, GFF, GF2, GF1, G1F, etc.) can be cited.

The touch panel and the touch panel device of the present invention is preferably an on-cell type, an OGS type, a TOL type, another constitution, or various kinds of out-cell type in terms of the effect in improving framework visibility and improving taper visibility being easily exhibited.

The touch panel of the present invention and the touch panel display device equipped with the touch panel of the present invention as a constituent element may employ a constitution disclosed in "Saishin Tacchipaneru Gijutsu" (Latest Touch Panel Technology) (published on 6 Jul. 2009, Technotimes), edited by Yuji Mitani, "Tacchipaneru-no-gijutsu-to-kaihatsu" (Touch Panel Technology and Development), CMC Publishing Co., Ltd. (2004, 12), FPD International 2009 Forum T-11 Lecture Textbook, Cypress Semiconductor Corporation Application Note AN2292, etc.

In accordance with the present invention, there can be provided a touch panel member that is excellent in terms of suppression of visibility of a transparent electrode and has low total reflection for visible light, and a touch panel and a touch panel display device having the touch panel member.

EXAMPLES

The present invention is more specifically explained below by reference to Examples. The materials, amounts used, proportions, processing details, processing procedures, etc. shown in the Examples below may be modified as appropriate as long as the modifications do not depart from the spirit and scope of the present invention. Therefore, the scope of the present invention is not limited by the specific Examples shown below. 'Parts' and '%' are on a mass basis unless otherwise specified.

Example 1

<Preparation of Transparent Substrate>

First, a 550 mm×650 mm glass plate (nonalkaline glass, NH Techno Glass Co., Ltd., refractive index 1.53) was prepared as a transparent substrate, treated with a surfactant using ultrapure water, and subsequently washed by an ultrasound washing treatment.

The transparent substrate was designed so as to produce 50 touch panel member faces as follows, and any one face thereof was used in Example <Plate Making for Lead-Out Wiring>

A 30 nm thick film of Ag—Pd—Cu alloy (APC) was formed on the entire face of the glass substrate by sputtering as metal wiring for supplementing the resistance of an outer peripheral wiring part. Subsequently, a lead-out wiring pattern was formed in an area outside an active area by a photolithographic method using a positive photosensitive material (AZ Electronic Materials). Furthermore, a mixed solution of phosphoric acid, nitric acid, and acetic acid was used as an etchant, unwanted parts were removed, and subsequently unwanted positive photosensitive material was stripped using sodium hydroxide, thus forming a metal wiring pattern.

<Formation of Transparent Electrode Layer Film>

Subsequently, in order to form a transparent electrode layer above the face of the transparent substrate having the lead-out wiring formed thereon, an 80 nm thick film of ITO was formed on the entire face by sputtering. A transparent electrode layer comprising a predetermined touch sensor pattern was formed by a photolithographic method using the same positive photosensitive material as for the lead-out wiring. An oxalic acid-based solution was used as the etchant for ITO.

<Formation of Protective Layer>

Formation of Gradient Layer

Subsequently, a film comprising the elements silicon (Si), oxygen (O), and nitrogen (N) was formed above the substrate as a gradient layer. In this process, the pressure prior to sputtering was 0.0001 Pa, silicon was used as a target, and direct current (DC) power was applied. Furthermore, as a discharge gas Ar gas was introduced. While gradually decreasing the ratio of $N_2$ and $O_2$ gases ($N_2/O_2$) as the film formation time passed, a film was formed using a DC magnetron sputtering method under an atmosphere of 0.4 Pa. Sputtering was carried out with a center roll temperature of 2° C.

Moreover, feedback to a flow meter for nitrogen and oxygen gases was carried out so that the nitrogen to oxygen ratio in the thin film was a predetermined ratio while always monitoring the partial pressure of nitrogen and oxygen in the atmosphere using a sputter process monitor (XPR2, LEYBOLD INFICON). As described above, a thin film layer with a thickness of 70 nm having a formulation gradient and comprising the elements Si, O, and N was deposited.

The pencil hardness of the thin film layer having a formulation gradient was H or higher.

Subsequently, the gradient layer corresponding to the lead-out wiring parts was removed by a photolithography method using the same positive photosensitive material as that for the lead-out wiring, etching, and stripping.

Formation of Planarization Layer

A substrate having a gradient layer formed thereon was slit-coated with composition 1 below (negative-working photosensitive composition 0) and dried at 90° C. for 2 minutes, thus forming a composition layer.

Exposure to a predetermined pattern was carried out, and unwanted parts were removed using a 2.38% aqueous solution of tetramethylammonium hydroxide (TMAH). Subsequently, it was heated in an oven at 180° C. for 30 minutes, thus forming a planarization layer.

The pencil hardness of the planarization layer thus obtained was H or higher.

Formulation of Composition 1 (negative-working photosensitive composition 0) Aronix TO-2349 (carboxylic acid group-containing monomer, Toagosei Co., Ltd.): 18 parts
Dipentaerythritol hexaacrylate (DPHA, Nippon Kayaku Co., Ltd.): 75 parts
Irgacure OXE-01 (radical polymerization initiator, BASF): 3 parts
KBM-5103 (silane coupling agent, Shin-Etsu Chemical Co., Ltd.): 4 parts
Megafac F-554 (surfactant, DIC): 0.1 parts
Propylene glycol monomethyl ether acetate: 400 parts <Evaluation of Pencil Hardness>

Each layer was subjected to measurement of pencil hardness under the conditions below.
Method: measured in accordance with JIS K 5600-5-4.
Type of pencil: Uni, manufactured by Mitsubishi Pencil Co., Ltd.
Load: 750 gw
Angle: 45°
Speed: 0.1 cm/sec
Temperature: 25° C.

<Measurement of Refractive Index>

An electron microscope photograph of a cross section of the substrate that had been subjected to formation of up to the planarization layer was taken, and the film thickness of each layer was measured.

The film thickness of the transparent electrode layer was 0.080 μm, the film thickness of the gradient layer was 0.070 μm, and the film thickness of the planarization layer was 1.5 μm.

It was confirmed that the taper angle of the transparent electrode was 25°.

Furthermore, the element distribution of a cross section was measured using X-ray photoelectron spectrometry, and it was confirmed that the gradient layer comprised Si, O, and N, the formulation changed continuously, and the refractive index thereof was high on the transparent electrode side and low on the planarization layer side. Moreover, it was confirmed that the planarization layer was a uniform film comprising an organic material and was free from high refractive index materials such as Ti, Zr, Hf, and Nb.

That is, the refractive index of the touch panel member was presumed to be: transparent electrode ≈transparent electrode side of gradient layer>planarization layer side of gradient layer (> or ≈) planarization layer.

Based on this information, the refractive index at 550 nm of each of the layers was measured using a VASE spectroscopic ellipsometer (J. A. Woollam). Fitting was carried out using a Cauchy model.

The refractive index of the transparent electrode was 1.90, the refractive index of the interface, on the transparent electrode side, of the gradient layer was 1.90, it decreased substantially linearly and was 1.55 at the interface on the planarization layer side, and the refractive index of the planarization layer was 1.53.

Measurement of refractive index in the present invention was carried out as follows.
A. when a single film of each layer could be obtained, the single film of each layer was measured using a spectroscopic ellipsometer.
B. when a single film of each layer could not be obtained (when only a layered film could be obtained), the layered film was measured using a spectroscopic ellipsometer.

Measurement was carried out by method B in this Example.

<Evaluation of Framework Visibility>

A substrate (touch panel member) that had been subjected to formation of up to the protective layer was examined by eye under a fluorescent lamp.

The evaluation criteria are shown below. A, B, and C are within a practical range.
A: electrode pattern could not be seen at all.
B: at a distance of 20 cm or less from substrate, electrode pattern was slightly visible, but could not be seen at 20 cm or greater.
C: at a distance of 20 cm or greater from substrate, electrode pattern was slightly visible.
D: at a distance of 20 cm or greater from substrate, electrode pattern could be seen clearly.

<Evaluation of Taper Visibility>

A substrate that had been subjected to formation of up to the protective was examined by eye while applying light obliquely using a torch.

The evaluation criteria are shown below. A, B, and C are within a practical range.
A: light reflected from taper parts could not be seen at all.
B: at a distance of 20 cm or less from substrate, light reflected from taper parts was slightly visible, but could not be seen at 20 cm or greater.
C: at a distance of 20 cm or greater from substrate, light reflected from taper parts was slightly visible.
D: at a distance of 20 cm or greater from substrate, light reflected from taper parts could be seen clearly.

<Evaluation of Total Reflection>

A substrate that had been subjected to formation of up to the protective layer was placed on black paper and examined by eye under illumination with a fluorescent lamp.

The evaluation criteria are shown below. A, B, and C are within a practical range.
A: whitishness or glare could not be sensed at all.
B: at a distance of 20 cm or less from substrate, slight impression of whitishness or glare, but could not be sensed at 20 cm or greater.
C: at a distance of 20 cm or greater from substrate, slight impression of whitishness or glare.
D: at a distance of 20 cm or greater from substrate, strong impression of whitishness or glare.

Example 2

<Synthesis of Polymer P1>

A mixed solution of propylene glycol monomethyl ether acetate (PGMEA) (120 parts) and a total of 100 parts of tetrahydrofuran-2-yl methacrylate (0.40 molar equivalents), methacrylic acid (0.10 molar equivalents), and (3-ethyloxetan-3-yl)methyl methacrylate (0.50 molar equivalents) was heated to 70° C. under a flow of nitrogen. Added to this mixed solution dropwise over 3.5 hours while stirring was a mixed solution of the radical polymerization initiator V-601 (dimethyl 2,2'-azobis(2-methylpropionate), Wako Pure Chemical Industries, Ltd., 12.0 parts) and PGMEA (80 parts). After the dropwise addition was completed, a reaction was carried out at 70° C. for 2 hours, thus giving a PGMEA solution of polymer P1. PGMEA was further added so as to adjust the solids content concentration to 40 mass %.

The weight-average molecular weight (Mw) of polymer P1 thus obtained measured by gel permeation chromatography (GPC) was 15,000.

<Preparation of Dispersion I>
Formulation of Dispersion I
TTO-51 (C): titanium oxide particles (Ishihara Sangyo Kaisha Ltd.): 25 parts
DISPERBYK-111 (dispersant, BYK-Chemie GmbH.Japan): 7.5 parts
PGMEA (propylene glycol monomethyl ether acetate): 62.5 parts A dispersion composition having the above formulation was dispersed using an Ultra Apex Mill manufactured by Kotobuki Engineering and Manufacturing Co., Ltd. by circulating for 150 min with a packing ratio for 0.05 mm zirconia beads of 75% at a peripheral speed of 12 m/sec and a circulation flow rate of 180 g/min, thus preparing dispersion I.

<Preparation of Positive-Working Photosensitive Resin Composition I>

A uniform solution was formed by combining and mixing the formulation below and then subjected to filtration using a polyethylene filter having a pore size of 0.2 μm, thus giving positive-working photosensitive resin composition I.
Formulation
Propylene glycol monomethyl ether acetate (PGMEA): 32.4 parts
Polymer P1 (solids content 40 mass % PGMEA solution): 12.0 parts
Irgacure PAG-103 (photo-acid generator, BASF): 3.0 parts
KBM-403 (silane coupling agent, Shin-Etsu Chemical Co., Ltd.): 2.0 parts
CMTU (compound below, Toyo Kasei Kogyo Co., Ltd.): 0.3 parts
Ftergent FTX-218 (surfactant, Neos Company Limited): 0.3 parts
Cyclic thiourea compound below: 0.3 parts
Dispersion I: 50.0 parts

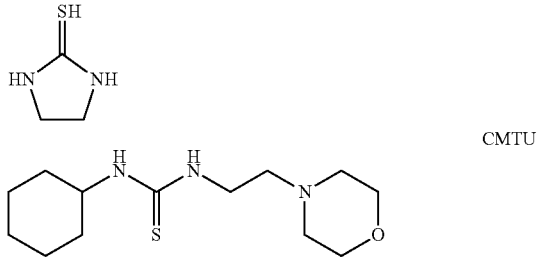

CMTU

<Formation of Protective Layer>
Formation of Planarization Layer

A substrate that had been subjected to film formation for the transparent electrode layer as in Example 1 was slit-coated with positive-working photosensitive resin composition I and dried at 90° C. for 2 minutes. This film was exposed pattern-wise using an ultra high pressure mercury lamp, developed with a 0.7% aqueous solution of TMAH, and rinsed with pure, thus removing the composition layer for the lead-out wiring parts. It was further heated in an oven at 200° C. for 30 minutes, thus giving a cured film layer (planarization layer) above the transparent electrode layer. Furthermore, the pencil hardness was H or higher.
Formation of Gradient Layer
(1) Preparation of Inorganic Component Liquid A mixed solution of 5 g of ethanol, 2.5 g of conc. hydrochloric acid, and 0.5 g of water was added dropwise to a mixed solution of 12 g of titanium tetraisopropoxide and 10 g of ethanol in a water bath and stirred, and a reaction was then carried out at room temperature (25° C., the same applies below) for 5 hours, thus preparing inorganic component liquid 1.
(2) Preparation of Organic Component Solution 0.1 g of 2,2'-azobisisobutyronitrile was dissolved in a mixed solution of 10.9 g of methyl methacrylate and 1.36 g of 3-methacryloxypropyltrimethoxysilane, and a reaction was carried out at 75° C. for 3 hours while stirring, thus giving a copolymer having a weight-average molecular weight of about 60,000 on a polystyrene basis by a gel permeation chromatography (GPC) method. 0.1 g of this copolymer was dissolved in 10 mL of acetone, thus preparing a 10 g/L organic component solution 3.
(3) Preparation of Coating Liquid Acetone (3.8 parts), ethanol (3.0 parts), inorganic component liquid 1 (2.5 parts), and organic component solution 3 (1 part) were mixed and stirred at 25° C. for 10 minutes, thus giving a coating liquid.

Subsequently, a 75 μm thick PET film was slit-coated with the coating liquid and dried at 80° C. overnight, thus producing a gradient layer transfer material.

This transfer material was laminated on a substrate that had been subjected to formation of up to a planarization layer, thus carrying out transfer of the gradient layer.

After the PET film was peeled off, the substrate having the gradient layer was coated with a positive photosensitive material as a resist, and the gradient layer corresponding to lead-out wiring parts was removed by means of a photolithographic method, and dry etching and resist stripping. It was heated in an oven at 200° C. for 30 minutes. The pencil hardness of the gradient layer was H or higher.
<Measurement of Refractive Index>

An electron microscope photograph of a cross section of the substrate that had been subjected to formation of up to the gradient layer was taken, and the film thickness of each layer was measured.

It was confirmed that the film thickness of the transparent electrode layer was 0.080 μm, the film thickness of the planarization layer was 1.2 μm, the film thickness of the gradient layer was 0.080 μm, and the taper angle of the transparent electrode was 25°.

Furthermore, the element distribution was measured by X-ray photoelectron spectrometry of a cross section; it was confirmed that the planarization layer was a film in which titanium oxide particles were dispersed in organic material at high concentration, and the gradient layer was a layer in which there was a continuous gradient of components comprising Si, Ti, and O and an organic resin, the Ti proportion being higher the further toward the planarization layer side it was, and the Ti proportion being smaller the further toward the surface side it was.

That is, the refractive index of the touch panel member was presumed to be: transparent electrode≈planarization layer≈planarization layer side of gradient layer>surface side of gradient layer.

Based on this information, the refractive index at 550 nm of each of the layers was measured using a VASE spectroscopic ellipsometer (J. A. Woollam). Fitting was carried out using the Cauchy model.

The refractive index of the transparent electrode was 1.90, the refractive index of the planarization layer was 1.90, the refractive index of the interface, on the planarization layer side, of the gradient layer was 1.90, the refractive index decreased substantially linearly, and was 1.58 at the interface on the surface side.

The touch panel member thus obtained was subjected to evaluation in the same manner as in Example 1. The evaluation results are shown in Table Example 3

<Synthesis of Polymer P2>

In the same manner as for polymer P1, methacrylic acid (0.40 molar equivalents), glycidyl methacrylate (0.40 molar equivalents), dicyclopentanyl methacrylate (0.10 molar equivalents), and styrene (0.10 molar equivalents) were copolymerized, thus giving a 40 mass % PGMEA solution.

The weight-average molecular weight (Mw) of polymer P2 measured by gel permeation chromatography (GPC) was 10,000.

<Preparation of Negative-Working Photosensitive Resin Composition for Formation of Layer Having Refractive Index of 1.90>

A uniform solution was formed by combining and mixing the formulation below and then subjected to filtration using a polyethylene filter having a pore size of 0.2 μm, thus giving negative-working photosensitive resin composition I.
Formulation
Propylene glycol monomethyl ether acetate (PGMEA): 20 parts
Polymer P2 (solids content 40 mass % PGMEA solution): 1.0 parts
Dipentaerythritol hexaacrylate (Nippon Kayaku Co., Ltd.): 5.0 parts
Aronix TO-2349 (carboxylic acid group-containing monomer, Toagosei Co., Ltd.): 0.8 parts
Irgacure OXE-01 (radical polymerization initiator, BASF): 2.0 parts
KBM-5103 (silane coupling agent, Shin-Etsu Chemical Co., Ltd.): 1.0 parts
Ftergent FTX-218 (surfactant, Neos Company Limited): 0.3 parts
CMTU (compound above, Toyo Kasei Kogyo Co., Ltd.): 0.3 parts
Cyclic thiourea compound above: 0.3 parts
Dispersion I: 51.0 parts
<Preparation of Negative-Working Photosensitive Resin Composition II: For Formation of Layer Having Refractive Index of 1.58>

A uniform solution was formed by combining and mixing the formulation below and then subjected to filtration using a polyethylene filter having a pore size of 0.2 μm, thus giving negative-working photosensitive resin composition II.
Formulation
Propylene glycol monomethyl ether acetate (PGMEA): 20 parts
Polymer P2 (solids content 40 mass % PGMEA solution): 1.0 parts
Dipentaerythritol hexaacrylate (Nippon Kayaku Co., Ltd.): 5.0 parts
Aronix TO-2349 (carboxylic acid group-containing monomer, Toagosei Co., Ltd.): 0.8 parts
Irgacure OXE-01 (radical polymerization initiator, BASF): 2.0 parts
KBM-5103 (silane coupling agent, Shin-Etsu Chemical Co., Ltd.): 1.0 parts
Ftergent FTX-218 (surfactant, Neos Company Limited): 0.3 parts
NanoUse OZ-S3OK (zirconium oxide particle dispersion, Nissan Chemical Industries Ltd.): 12.0 parts <Formation of Protective Layer>

In the same manner as in Example 1, a substrate that had been subjected to formation of up to the transparent electrode layer was subjected to coating with negative-working photosensitive resin composition I and negative-working photosensitive resin composition II using an inkjet coating device: Dimatix Material Printer DMP-2831 (FUJIFILM Dimatix). First, only negative-working photosensitive resin composition I was discharged, the proportion of negative-working photosensitive resin composition II was gradually increased, and finally only negative-working photosensitive resin composition II was discharged, and drying was carried out at 90° C. for 2 minutes. Pattern exposure was carried out using an ultra high pressure mercury lamp, and the composition layer corresponding to lead-out wiring parts was removed by development using a 0.4% aqueous solution of TMAH and rinsing with pure. It was further heated in an oven at 200° C. for 30 minutes, thus giving a layer having a refractive index gradient above the transparent electrode layer. The pencil hardness was H or higher.
<Measurement of Refractive Index>

An electron microscope photograph of a cross section of the substrate that had been subjected to formation of the gradient layer was taken, and the film thickness of each layer was measured.

It was confirmed that the film thickness of the transparent electrode layer was 0.080 μm, the film thickness of the protective layer (gradient layer) was 1.5 μm, and the taper angle of the transparent electrode was 25°.

Furthermore, the element distribution was measured by X-ray photoelectron spectrometry of a cross section, and it was confirmed that the gradient layer was a layer in which there was a continuous gradient of components comprising Ti and Zr and an organic material, the Ti proportion being higher the further toward the transparent electrode side it was, Zr being higher the further toward the surface side it was, and the Zr proportion being lower than that of Ti.

The refractive index of this touch panel member was presumed to be: transparent electrode≈electrode side of gradient layer> surface side of gradient layer.

Based on this information, the refractive index at 550 nm of each of the layers was measured using a VASE spectroscopic ellipsometer (J. A. Woollam). Fitting was carried out using the Cauchy model.

The refractive index of the transparent electrode was 1.90, the refractive index of the interface, on the transparent electrode side, of the gradient layer was 1.90, and the refractive index decreased substantially linearly, and was 1.58 at the interface on the surface side.

Example 4

A touch panel member was obtained in the same manner as in Example 3 except that the refractive index adjusting layer in which there was a refractive index gradient in Example 3 was formed in the same manner as in 'Formation of gradient layer' of Example 1 prior to the formation of a transparent electrode film. Furthermore, the touch panel member thus obtained was subjected to evaluation in the same manner as in Example 1. The evaluation results are shown in Table 1.
<Measurement of Refractive Index>

An electron microscope photograph of a cross section of the substrate was taken, and the film thickness of each layer was measured.

It was confirmed that the film thickness of the refractive index adjusting layer was 0.080 μm, the film thickness of the transparent electrode layer was 0.080 μm, the film thickness of the gradient layer was 1.5 μm, and the taper angle of the transparent electrode was 25°.

Furthermore, the element distribution was measured by X-ray photoelectron spectrometry of a cross section, and it was confirmed that the refractive index adjusting layer comprised Si, O, and N and the formulation changed continuously, the refractive index thereof being high on the transparent electrode side and low on the substrate side.

It was confirmed that the gradient layer was a layer in which there was a continuous gradient of components comprising Ti and Zr and an organic material, the Ti proportion being higher the further toward the transparent electrode side it was, Zr being higher the further toward the surface side it was, and the Zr proportion being lower than that of Ti.

The refractive index of this touch panel member was presumed to be: substrate side of refractive index adjusting layer<transparent electrode side of refractive index adjusting layer≈transparent electrode≈electrode side of gradient layer> surface side of gradient layer.

Based on this information, the refractive index at 550 nm of each of the layers was measured using a VASE spectroscopic ellipsometer (J. A. Woollam). Fitting was carried out using a Cauchy model.

The refractive index of the interface, on the substrate side, of the refractive index adjusting layer was 1.53, the refractive index substantially linearly increased and was 1.90 at the interface on the transparent electrode side, the refractive index of the transparent electrode was 1.90, the refractive index of the interface, on the transparent electrode side, of the gradient layer was 1.90, and the refractive index decreased substantially linearly and was 1.58 at the interface on the surface side.

Example 5

A touch panel member was produced in the same manner as in Example 1 except that the time taken for formation of the transparent electrode in Example 1 was increased. The touch panel member thus obtained was subjected to measurement and evaluation in the same manner as in Example 1. The evaluation results are shown in Table 1.

The thickness of the transparent electrode was 140 nm with a refractive index of 1.90, the film thickness of the gradient layer was 80 nm, the refractive index of the interface on the transparent electrode side was 1.90, the refractive index decreased substantially linearly and was 1.55 at the interface on the planarization layer side, the film thickness of the planarization layer was 1.5 μm, and the refractive index was 1.53.

Example 6

A touch panel member was produced in the same manner as in Example 1 except that the transparent electrode material in Example 1 was changed to IZO, and the conditions were adjusted so that the refractive index at the initial stage of formation of the gradient layer was high. The touch panel member thus obtained was subjected to measurement and evaluation in the same manner as in Example 1. The evaluation results are shown in Table 1.

The thickness of the transparent electrode was 80 nm with a refractive index of 2.04, the film thickness of the gradient layer was 80 nm, the refractive index of the interface on the transparent electrode side was 2.04, the refractive index decreased substantially linearly and was 1.55 at the interface on the planarization layer side, and the film thickness of the planarization layer was 1.5 μm with a refractive index of 1.53.

Example 7

A touch panel member was produced in the same manner as in Example 3 except that the transparent electrode material in Example 3 was changed to IZO. The touch panel member thus obtained was subjected to measurement and evaluation in the same manner as in Example 1. The evaluation results are shown in Table 1.

The thickness of the transparent electrode was 80 nm with a refractive index of 2.04, the film thickness of the gradient layer was 1,500 nm, the refractive index of the interface on the transparent electrode side was 1.90, and the refractive index decreased substantially linearly and was 1.58 at the interface on the surface side.

Example 8

A touch panel member was produced in the same manner as in Example 7 except that in Example 7 the refractive index adjusting layer formation step of Example 4 was added. The touch panel member thus obtained was subjected to measurement and evaluation in the same manner as in Example 1. The evaluation results are shown in Table 1.

The refractive index of the interface, on the substrate side, of the refractive index adjusting layer was 1.53, and the refractive index substantially linearly increased and was 2.00 at the interface on the transparent electrode side; the thickness of the transparent electrode was 80 nm with a refractive index of 2.04, the film thickness of the gradient layer was 1500 nm, the refractive index of the interface on the transparent electrode side was 1.90, and the refractive index decreased substantially linearly and was 1.58 at the interface on the surface side.

Example 9

A touch panel member was produced in the same manner as in Example 7 except that the transparent electrode formation step in Example 7 was adjusted. The touch panel member thus obtained was subjected to measurement and evaluation in the same manner as in Example 1. The evaluation results are shown in Table 1.

The thickness of the transparent electrode was 80 nm with a refractive index of 2.07, the film thickness of the gradient layer was 1,500 nm, the refractive index of the interface on the transparent electrode side was 1.90, and the refractive index decreased substantially linearly and was 1.58 at the interface on the surface side.

Example 10

<Preparation of Negative-Working Photosensitive Resin Composition III: For Formation of Layer Having Refractive Index of 1.90>

A uniform solution was formed by combining and mixing the formulation below and then subjected to filtration using a polyethylene filter having a pore size of 0.2 μm, thus giving negative-working photosensitive resin composition I.
Formulation
Propylene glycol monomethyl ether acetate (PGMEA): 20 parts
Polymer P2 (solids content 40 mass % PGMEA solution): 3.0 parts Dipentaerythritol hexaacrylate (Nippon Kayaku Co., Ltd.): 3.0 parts
Fluorene acrylate compound (OGSOL EA-0200, Osaka Gas Chemicals Co., Ltd.): 0.8 parts
Irgacure OXE-01 (radical polymerization initiator, BASF): 2.0 parts
KBM-5103 (silane coupling agent, Shin-Etsu Chemical Co., Ltd.): 1.0 parts
Ftergent FTX-218 (surfactant, Neos Company Limited): 0.3 parts
CMTU (compound above, Toyo Kasei Kogyo Co., Ltd.): 0.3 parts
Cyclic thiourea compound above: 0.3 parts
Dispersion I: 50.0 parts
Formation of Planarization Layer A substrate that had been subjected to film formation for up to the transparent electrode layer as in Example 1 was slit-coated with negative-working photosensitive resin composition III and dried at 90° C. for 2 minutes. This film was exposed pattern-wise using an ultra high pressure mercury lamp, developed with a 0.7% aqueous solution of TMAH, and rinsed with pure, thus removing the composition layer for lead-out wiring parts. It was further heated in an oven at 200° C. for 30 minutes, thus giving a cured film layer (planarization layer) above the transparent electrode layer. The pencil hardness was at least H.

Formation of Gradient Layer

A touch panel member was produced by subjecting the substrate that had been subjected to formation of up to the planarization layer to sputtering and etching in the same manner as in Example 1, thus forming a gradient layer above the planarization layer. The touch panel member thus obtained was subjected to measurement and evaluation in the same manner as in Example 1. The evaluation results are shown in Table 1.

The thickness of the transparent electrode was 80 nm with a refractive index of 1.90, the film thickness of the planarization layer was 2.0 µm with a refractive index of 1.90, the film thickness of the gradient layer was 80 nm, the refractive index of the interface on the planarization layer side was 1.90, and the refractive index decreased substantially linearly and was 1.55 at the interface on the surface side.

Comparative Example 1

A touch panel member was produced in the same manner as in Example 3 except that the protective layer in Example 3 was formed as follows. The touch panel member thus obtained was subjected to measurement and evaluation in the same manner as in Example 1. The evaluation results are shown in Table 1.

Negative-working photosensitive composition I was applied by inkjet coating in the same manner as in Example 3 and dried at 90° C. for 2 minutes. Pattern exposure was carried out using an ultra high pressure mercury lamp, and the composition layer corresponding to lead-out wiring parts was removed by development using a 0.4% aqueous solution of TMAH and rinsing with pure. It was further heated in an oven at 200° C. for 30 minutes.

Furthermore, a mixed liquid of 37 parts by mass of negative-working photosensitive resin composition I and 63 parts by mass of negative-working photosensitive resin composition II was applied by inkjet coating in the same manner as in Example 3 and dried at 90° C. for 2 minutes. Pattern exposure was carried out using an ultra high pressure mercury lamp, and the composition layer corresponding to lead-out wiring parts was removed by development using a 0.4% aqueous solution of TMAH and rinsing with pure. It was further heated in an oven at 200° C. for 30 minutes.

In this way, a protective layer comprising two different layers above the transparent electrode layer was obtained.

The thickness of the transparent electrode was 80 nm with a refractive index of 1.90, the thickness of the layer, close to the electrode, of the protective layer was 0.70 µm with a refractive index of 1.90, and the thickness of the layer, far from the electrode, of the protective layer was 0.70 µm with a refractive index of 1.70.

Comparative Example 2

A touch panel member was produced in the same manner as in Example 3 except that the protective layer in Example 3 was formed as follows. The touch panel member thus obtained was subjected to measurement and evaluation in the same manner as in Example 1. The evaluation results are shown in Table 1.

Coating of negative-working photosensitive resin composition I and negative-working photosensitive resin composition II was carried out using an inkjet coating device: Dimatix Material Printer DMP-2831 (FUJIFILM Dimatix).

First, only negative-working photosensitive resin composition I was discharged, the proportion of negative-working photosensitive resin composition II was gradually increased, and finally discharging was carried out so that the proportion of negative-working photosensitive resin composition II was 30%; drying was carried out at 90° C. for 2 minutes. Pattern exposure was carried out using an ultra high pressure mercury lamp, and the composition layer corresponding to lead-out wiring parts was removed by development using a 0.4% aqueous solution of TMAH and rinsing with pure. It was further heated in an oven at 200° C. for 30 minutes, thus giving a layer having a refractive index gradient above the transparent electrode layer.

The thickness of the transparent electrode was 80 nm with a refractive index of 1.90, the thickness of the gradient layer was 1.0 µm, the refractive index of the interface on the transparent electrode side was 1.90, and the refractive index decreased substantially linearly and was 1.80 at the interface on the surface side.

Comparative Example 3

A touch panel member was produced in the same manner as in Example 6 except that the protective layer in Example 6 was formed as follows. The touch panel member thus obtained was subjected to measurement and evaluation in the same manner as in Example 1. The evaluation results are shown in Table 1.

Coating of negative-working photosensitive resin composition I and negative-working photosensitive resin composition II was carried out using an inkjet coating device: Dimatix Material Printer DMP-2831 (FUJIFILM Dimatix).

First, a mixed liquid of 70 parts by mass of negative-working photosensitive resin composition I and 30 parts by mass of negative-working photosensitive resin composition II was discharged, the proportion of negative-working photosensitive resin composition II was gradually increased, and finally only negative-working photosensitive resin composition II was discharged; drying was carried out at 90° C. for 2 minutes. Pattern exposure was carried out using an ultra high pressure mercury lamp, and the composition layer corresponding to lead-out wiring parts was removed by development using a 0.4% aqueous solution of TMAH and rinsing with pure. It was further heated in an oven at 200° C. for 30 minutes, thus giving a layer having a refractive index gradient above the transparent electrode layer.

The thickness of the transparent electrode was 80 nm with a refractive index of 2.04, the thickness of the gradient layer was 1.5 μm, the refractive index of the interface on the transparent electrode side was 1.80, and the refractive index decreased substantially linearly and was 1.58 at the interface on the surface side.

Comparative Example 4

A touch panel member was produced in the same manner as in Example 4 except that the protective layer in Example 4 was formed as follows. The touch panel member thus obtained was subjected to measurement and evaluation in the same manner as in Example 1. The evaluation results are shown in Table 1.

Negative-working photosensitive composition 0 was applied by slit-coating and dried at 90° C. for 2 minutes, thus forming a composition layer.

Exposure to a predetermined pattern was carried out, and unwanted parts were removed using a 2.38% aqueous solution of TMAH. Subsequently, heating was carried out in an oven at 140° C. for 30 minutes, thus forming a planarization layer.

The thickness of the refractive index adjusting layer was 80 nm, the refractive index of the interface on the substrate side was 1.53, the refractive index substantially linearly increased and was 1.90 at the interface on the transparent electrode side, the thickness of the transparent electrode was 80 nm with a refractive index of 1.90, and the thickness of the protective layer was 1.5 μm with a uniform refractive index of 1.53.

<Preparation of Touch Panel Display Device>

A liquid crystal display device produced by a method described in JP-A-2009-47936 was laminated with the front face plate, thus preparing by a known method a touch panel display device comprising a capacitance type input device as a constituent element.

As a result it operated well as a touch panel. Furthermore, the transparent electrode pattern was not visible, and an image display device having excellent visibility suppression was obtained.

Examples 12 to 20

Touch panel display devices were produced in the same manner as in Example 11 except that the protective layer of Example 1 was changed to those in Examples 2 to 10. As a result, they operated well as touch panels. Furthermore, the transparent electrode pattern was not visible, and image display devices having excellent visibility suppression were obtained.

What is claimed is:

1. A touch panel member comprising, in order, at least
a transparent substrate,
a transparent electrode, and
a protective layer provided so as to cover the transparent electrode and having a thickness of 0.04 to 10 μm,
the protective layer being a single-layered structure, the protective layer having a refractive index that decreases continuously from a first surface of the protective layer to a second surface opposite to the first surface, the refractive index of the protective layer is the refractive index within the protective layer,

TABLE 1

| | Transparent electrode | | | | | |n(protect-electrode) − n(protect-surface)| | |n(electrode) − n(protect-electrode)| | |n(protect-electrode) − n(protect-surface)| | Δn | Gradient layer thickness (nm) | Taper visibility | Framework visibility | Total reflection |
|---|---|---|---|---|---|---|---|---|---|---|---|---|
| | Film thickness (nm) | Refractive index | Taper angle (°) | n(protect-electrode) | n(protect-surface) | | | | | | | |
| Ex. 1 | 80 | 1.90 | 25 | 1.90 | 1.53 | 0.00 | 0.37 | 0.088 | 80 | A | A | B |
| Ex. 2 | 80 | 1.90 | 25 | 1.90 | 1.58 | 0.00 | 0.32 | 0.092 | 80 | A | A | B |
| Ex. 3 | 80 | 1.90 | 25 | 1.90 | 1.58 | 0.00 | 0.32 | 0.0004 | 1,500 | A | A | B |
| Ex. 4 | 80 | 1.90 | 25 | 1.90 | 1.58 | 0.00 | 0.32 | 0.0004 | 1,500 | A | A | A |
| Ex. 5 | 140 | 1.90 | 15 | 1.90 | 1.53 | 0.00 | 0.37 | 0.088 | 80 | A | A | B |
| Ex. 6 | 80 | 2.04 | 30 | 2.00 | 1.53 | 0.04 | 0.47 | 0.12 | 80 | A | A | B |
| Ex. 7 | 80 | 2.04 | 30 | 1.90 | 1.58 | 0.14 | 0.32 | 0.0004 | 1,500 | B | B | B |
| Ex. 8 | 80 | 2.04 | 30 | 1.90 | 1.58 | 0.14 | 0.32 | 0.0004 | 1,500 | B | A | B |
| Ex. 9 | 80 | 2.07 | 28 | 1.90 | 1.58 | 0.17 | 0.32 | 0.0004 | 1,500 | C | C | B |
| Ex. 10 | 80 | 1.90 | 25 | 1.90 | 1.55 | 0.00 | 0.35 | 0.088 | 80 | A | A | B |
| Comp. Ex. 1 | 80 | 1.90 | 25 | 1.90 | 1.70 | 0.00 | 0.20 | 0.20 | 0 | A | A | D |
| Comp. Ex. 2 | 80 | 1.90 | 25 | 1.90 | 1.80 | 0.00 | 0.10 | 0.002 | 1,000 | A | A | D |
| Comp. Ex. 3 | 80 | 2.04 | 30 | 1.80 | 1.58 | 0.24 | 0.22 | 0.003 | 1,500 | D | D | B |
| Comp. Ex. 4 | 80 | 1.90 | 25 | 1.53 | 1.53 | 0.37 | 0.00 | 0.00 | 0 | D | A | D |

Example 11

<Preparation of Touch Panel Display Device>
<Preparation of Touch Panel>

In Example 18 described in JP-A-2014-71306, as a transparent protective layer a layer was formed in the same manner as for the protective layer of Example 1, thus giving a touch panel (front face plate) of the touch panel member of the present invention.

wherein the protective layer is a layer comprising a compound selected from the group consisting of a titanoxane, a zirconoxane, a titanoxane-zirconoxane condensation product, titanium oxide, zirconium oxide, and a titanium-zirconium composite oxide, the compound is dispersed along an entire thickness direction of the protective layer, a content of the compound decreases from the first surface of the protective layer to the second surface opposite to the first surface, and the first surface faces the transparent substrate, and the protective layer satisfying Expression 1 and Expression 2 below, $$|n(\text{electrode})-n(\text{protect-electrode})|\leq 0.2 \qquad (1)$$

$$0.2\leq n(\text{protect-electrode})-n(\text{protect-surface}) \qquad (2)$$

wherein in the expressions, the refractive index of the transparent electrode is defined as n(electrode), the refractive index of an interface on the transparent electrode side of the protective layer is defined as n(protect-electrode), and the refractive index of an interface, on the side opposite to the transparent substrate, of the protective layer is defined as n(protect-surface).

2. The touch panel member according to claim 1, wherein the protective layer satisfies Expression 3 below, $$0\leq \Delta n\leq 0.15 \qquad (3)$$

wherein in the expression, Δn denotes the amount of change in the refractive index of the protective layer from a given position of the protective layer to a position moved by 20 nm in the transparent substrate direction along a direction perpendicular to the plane of the transparent substrate on which the transparent electrode is provided.

3. The touch panel member according to claim 2, wherein Δn is greater than 0 but less than 0.15.

4. The touch panel member according to claim 1, wherein a taper angle formed between the plane of the transparent substrate on which the transparent electrode is provided and a side face of the transparent electrode is 2° to 80°.

5. The touch panel member according to claim 1, wherein the refractive index of the transparent electrode is at least 1.76 but no greater than 2.30.

6. The touch panel member according to claim 5, wherein the refractive index of the transparent electrode is at least 1.86 but no greater than 2.20.

7. The touch panel member according to claim 1, wherein it further comprises an adjacent layer that is in contact with the interface, on the side opposite to the transparent substrate, of the protective layer, the protective layer and the adjacent layer satisfying Expression 4 below, $$|n(\text{protect-surface})-n(\text{adjacent})|\leq 0.2 \qquad (4)$$

wherein in the expression, the refractive index of the adjacent layer is defined as n(adjacent).

8. The touch panel member according to claim 1, wherein the protective layer further comprises an organic material.

9. The touch panel member according to claim 1, wherein the protective layer is a layer comprising titanium oxide particles, zirconium oxide particles, and/or titanium-zirconium composite oxide particles.

10. A touch panel comprising the touch panel member according to claim 1.

11. A touch panel display device comprising the touch panel member according to claim 1.

12. The touch panel member according to claim 1, wherein a region where the refractive index decreases continuously has a thickness of at least 20 nm in a thickness direction of the protective layer.

13. The touch panel member according to claim 1, wherein a pencil hardness of the protective layer is a hardness of B or higher.

* * * * *